(12) United States Patent
Hayama et al.

(10) Patent No.: US 6,374,733 B1
(45) Date of Patent: Apr. 23, 2002

(54) METHOD OF MANUFACTURING CERAMIC SUBSTRATE

(75) Inventors: Masaaki Hayama, Nara; Noboru Mouri, Osaka; Hayami Matsunaga, Osaka; Masayuki Mizuno, Osaka; Eiji Kawamoto, Osaka; Yuji Yagi, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/601,776

(22) PCT Filed: Dec. 6, 1999

(86) PCT No.: PCT/JP99/06812

§ 371 Date: Sep. 25, 2000

§ 102(e) Date: Sep. 25, 2000

(87) PCT Pub. No.: WO00/35260

PCT Pub. Date: Jun. 15, 2000

(30) Foreign Application Priority Data

Dec. 7, 1998 (JP) .......................... 10-346337
Dec. 17, 1998 (JP) .......................... 10-358960

(51) Int. Cl.⁷ .............................. B41M 1/10
(52) U.S. Cl. .................. 101/170; 101/150; 174/264; 438/108-611
(58) Field of Search ................ 101/123, 124, 101/129, 150, 163, 167, 169, 170; 156/230, 233, 249, 289, 89; 174/261–265; 438/108, 611, 616, 622, 623

(56) References Cited

U.S. PATENT DOCUMENTS

| | | | | |
|---|---|---|---|---|
| 5,106,461 A | * | 4/1992 | Volfson et al. | 205/125 |
| 5,609,704 A | * | 3/1997 | Hayama et al. | 156/230 |
| 6,051,448 A | * | 4/2000 | Hayama et al. | 438/108 |
| 6,310,304 B1 | * | 10/2001 | Hayama et al. | 101/153 |

FOREIGN PATENT DOCUMENTS

| | | |
|---|---|---|
| JP | 9-330843 | 12/1997 |
| JP | 10-27959 | 1/1998 |
| JP | 10-242620 | 9/1998 |
| JP | 10-256425 | 9/1998 |

* cited by examiner

*Primary Examiner*—Ren Yan
(74) *Attorney, Agent, or Firm*—McDermott, Will & Emery

(57) ABSTRACT

The present invention relates to a manufacturing method of a ceramic substrate used in various electronic appliances, and more particularly to a manufacturing method of a ceramic substrate forming a conductor pattern by intaglio printing. A conductive paste is supplied in the intaglio by using any one of screen mask, metal mask, or drawing device, and therefore the conductive paste can be supplied uniformly in desired positions only. The supplying amount of the conductive paste can be adjusted by repeating printing, so that an optimum amount can be set depending on the pattern. As a result, a fine wiring pattern of thick film can be easily formed, and a ceramic circuit board low in wiring resistance, high in wiring density, and high in dimensional precision of wiring pattern can be obtained.

14 Claims, 18 Drawing Sheets

METHOD OF MANUFACTURING CERAMIC SUBSTRATE

FIELD OF THE INVENTION

The present invention relates to a manufacturing method of ceramic circuit board used in various electronic appliances, and more particularly to a manufacturing method of ceramic circuit board for forming a conductor pattern on a ceramic substrate by intaglio printing.

BACKGROUND OF THE INVENTION

Recently, electronic appliances are reduced progressively in size, and electronic components used in the electronic appliances are rapidly becoming smaller in size. This trend is the same in printed circuit boards and ceramic circuit boards for forming electronic circuits. As a result, fine forming techniques of conductors and via holes for composing circuits, multi-layer forming techniques, and wiring techniques of higher density are demanded. In addition to the trend of higher integration of LSI chips, the number of electrodes is increasing, the electrode pitches are becoming narrower, and a mounting method suited to multiple-pin and narrow-pitch trend is demanded.

Generally, the manufacturing method of this kind of ceramic circuit board has been as shown in FIG. 30.

That is, FIG. 30 is a process chart showing a conventional manufacturing method of ceramic circuit board, in which a green sheet 51 of about 0.2 mm in thickness mainly made of alumina is prepared (step a), and via holes 52 are drilled in necessary positions by punching or $CO_2$ laser processing (step b). The via holes 52 are filled with conductive paste (for example, tungsten paste) by screen printing or other method, and dried, and vias 53 are formed (step c). A conductor pattern 54 of conductive paste is formed on the green sheet 51 in a desired circuit pattern by screen printing method (step d), and a first layer of circuit board 55 is formed.

Similarly, a second layer of circuit board 56, a third layer of circuit board 57, and, if necessary, a fourth layer of circuit board 58 are prepared (step e), and they are positioned and pressed, and a laminated circuit board 59 is obtained (step f). Finally, it is baked at high temperature of 900 to 1600° C., so that a ceramic multi-layer substrate 60 is obtained (step g).

Thus, according to this method, a higher density is achieved by increasing the number of layers.

However, such a conventional manufacturing method of ceramic circuit board has the following problems.

1) Since the conductor pattern 54 is formed by screen printing, it is very difficult to define the line width (W)/line interval (spacing)=75 $\mu$m/75 $\mu$m or less.

2) In the case of screen printing for forming the conductor pattern 54, as the pattern is finer, the film thickness is smaller, and for example, at W=75 $\mu$m, the film thickness is only about 5 $\mu$m, and the wiring resistance is higher.

3) When tungsten is used as wiring material, in particular, the wiring resistance is about 3 to 5 times higher than in the wiring of silver (Ag) or copper (Cu), and this defect is more significant when the pattern is finer, and it cannot be used as electric component in those cases.

4) Since the substrate and wiring materials are baked simultaneously at high temperature of about 900 to 1600° C., a material shrinkage of about 15 to 20% occurs after baking, and hence the substrate dimensions fluctuate widely. Because of shrinkage and fluctuation, the wiring dimensions also vary significantly, and connection with very fine bumps on the LSI is inaccurate in precision, and the mounting yield is lowered.

5) Further, when forming the conductor pattern 54 by screen printing, the line width is more than 75 $\mu$m (generally, 120 $\mu$m or more should be required in consideration of the printing yield and wiring resistance), and many lines are formed in a narrow area, and more layers for wiring are required, and as the number of layers is increased, or the dimensional precision is improved for the sake of mounting precision, the substrate cost becomes higher.

SUMMARY OF THE INVENTION

The invention is intended to solve such conventional problems, and it is hence an object thereof to realize a manufacturing method of ceramic circuit board as specified below.

1) To realize low wiring resistance, and very high wiring density, capable of forming conductor pattern in a very narrow line width, and forming conductor film in a large thickness in spite of narrow line width.

2) To form fine via patterns simultaneously when forming conductor pattern, and form dense wiring pattern of high dimensional precision.

3) To connect securely between layers if the number of layers is increased, and connect securely when mounting an LSI chip face down on the surface layer.

To achieve the object, the manufacturing method of ceramic circuit board of the invention is a manufacturing method of ceramic circuit board for forming a first conductor pattern on a ceramic substrate by intaglio printing, comprising:

(a) a step of preparing an intaglio by forming a first groove on the surface of a flexible resin base material in a pattern corresponding to a first conductor pattern, and forming a second groove in a pattern corresponding to the via or bump of the first conductor pattern, deeper than the first groove, (b) a step of supplying a conductive paste to fill up the first and second grooves, and drying, (c) a step of supplying an additional conductive paste to cover up for the volume loss by drying of the conductive paste at step (b), and filling up and drying again, repeating as many times as required, (d) a step of adhering together the intaglio and a ceramic substrate by applying heat and pressure in a specified range, and (e) a step of parting the intaglio from the ceramic substrate, transferring the pattern of conductive paste on the ceramic substrate, and baking to form a first conductor pattern, in which the conductive paste is supplied at steps (b) and (c) by using any one of screen mask, metal mask, and drawing device.

In this constitution, a fine wiring pattern of a sufficient film thickness can be easily formed, and a ceramic circuit board of low wiring resistance, high wiring density, and high dimensional precision of wiring pattern is obtained. Additional advantages of the present invention will become apparent to those skilled in the art from the following detailed description of the exemplary embodiments of the present invention. The invention itself can better be understood by reference to the following detailed description and the accompanying drawings.

BRIEF DESCRIPTION OF THE DRAWINGS

In the various figures, identical or similar elements, structures and operations are similarly numbered. Any differences between similarly numbered elements, structures and operations in the various figures will be apparent to the artisan from the figures or from the following description.

DETAILED DESCRIPTION OF THE INVENTION

Reference will now be made in detail to the presently preferred embodiments of the invention, examples of which are illustrated in the accompanying drawings.

Embodiment 1

A manufacturing method of ceramic circuit board in embodiment 1 of the invention is explained below.

Figure 1:
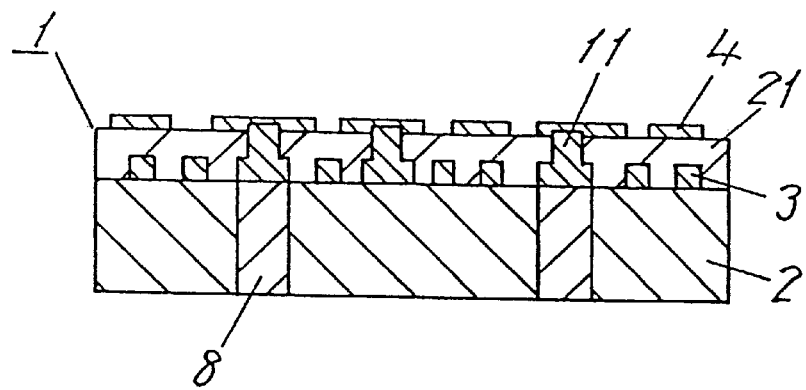
FIG. 1 is a sectional view of a ceramic circuit board formed according to a manufacturing method of ceramic circuit board in embodiment 1 of the invention.

FIG. 1 is a sectional view of a ceramic circuit board formed according to a manufacturing method of ceramic circuit board in embodiment 1 of the invention. In the drawing, reference numeral 1 is a ceramic circuit board, in which a first conductor pattern 3 is formed on a ceramic substrate 2 in conductor line width of 20 μm, line interval of 40 μm, and conductor film thickness of 20 μm after baking, and a via 11 of 100 μm in diameter is formed simultaneously in the first conductor pattern 3. A first insulating layer 21 is formed on the first conductor pattern 3, and a second conductor pattern 4 is formed thereon, and this second conductor pattern 4 is connected electrically to the via 11.

A manufacturing method for obtaining such ceramic circuit board is explained below in the sequence of steps while referring to FIG. 2 to FIG. 11. First, the first conductor pattern 3 shown in FIG. 1 is formed by intaglio printing. That is, in FIG. 2(a), the intaglio 40 is a polyimide film as a flexible resin base material having a thickness of 125 μm, and a laser beam in an ultraviolet region (wavelength 248 nm) is emitted by an excimer laser device so as to form a first groove 12 in a pattern corresponding to the first conductor pattern 3. The area illuminated with the laser beam is decomposed by photochemical reaction, and the first groove 12 is formed in the pattern corresponding to the first conductor pattern 3, and it is formed in the groove width of 25 μm and groove depth of 30 μm in the embodiment.

Next, in a pattern corresponding to the via 11 of the first conductor pattern 3, a second groove 13 is similarly formed by using the excimer laser device, and the second groove 13 is formed in the diameter of the deepest portion of 120 μm and groove depth of 90 μm in the embodiment.

Thus, by using the excimer layer, the first groove 12 may be formed in a width of 10 μm or less, and further the depth of the first and second grooves 12, 13 can be adjusted freely, and the depth can be set larger than the groove width, that is, the aspect ratio is large, which is one of the features of the intaglio 40.

As the flexible resin base material, in the case of processing by excimer laser, any material that is decomposed by photochemical reaction can be used, or, moreover, polyethylene terephthalate (PET) or polyether imide (PEI) may be also used. Incidentally, in the case of the intaglio 40 made of polyimide film, since the parting property of the conductive paste 42 applied to fill up the first and second grooves 12, 13 and the film is not sufficient, the conductive paste 42 is likely to be left over in the first and second grooves 12, 13 in the transferring step. In the embodiment, accordingly, a parting layer (not shown) is formed on the surface of the intaglio 40, in particular, on the surface of the first and second grooves 12, 13, and a monomolecular film of fluorocarbon is used as the parting layer.

Consequently, the groove of the intaglio 40 forming the parting layer is filled with Ag—Pd paste as conductor paste 42. As the method of application, by screen printing, the conductor paste 42 may be uniformly supplied in necessary positions, so that it can be supplied uniformly only in necessary positions.

The supply amount of the conductor paste 42 can be adjusted by overlaid printing, and an optimum amount can be set depending on the pattern. In the embodiment, using a screen mask 5 of 200-mesh size and emulsion of 20μ, by repeating printing three times, 120μ of the conductor paste 42 is applied on the intaglio 40.

Figure 2A:
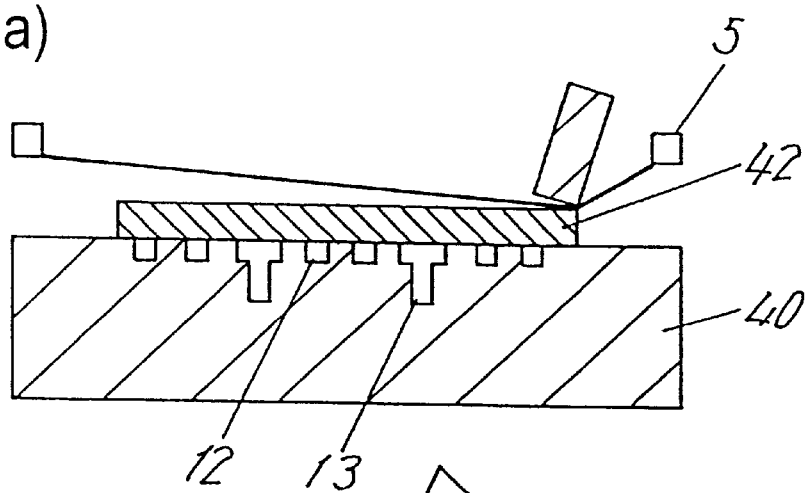
FIGS. 2(a)–(b) are sectional views showing schematically supply of paste in an intaglio by screen printing method in the embodiment.
Figure 2B:
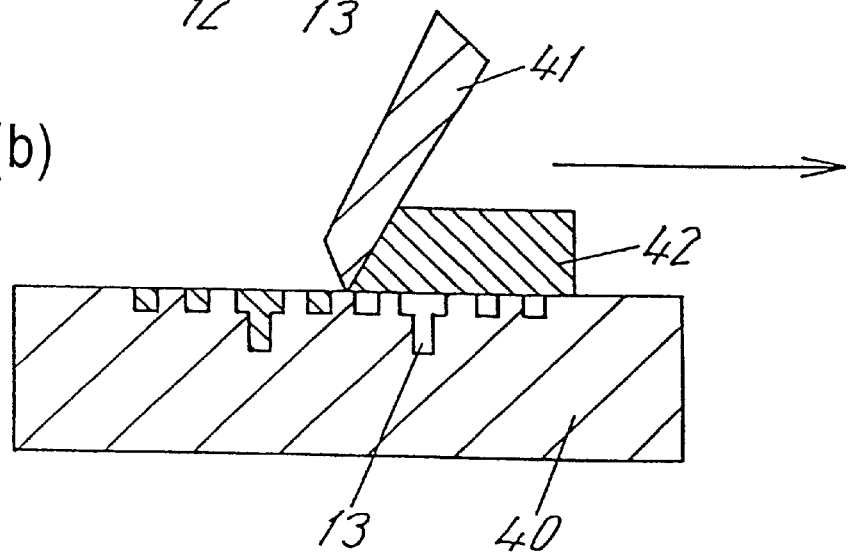

Herein, by supplying more than 90 μm which is the depth of the second groove 13, regardless of the viscosity of the conductor paste 42, the first and second grooves 12 and 13 respectively can be stably filled if there is a step difference or the depth is deep as in the second groove 13. As shown in FIG. 2(b), by using a squeegee 41, the groove is filled with conductor paste 42, and extra conductor paste 42 is scraped off.

Figure 3A:
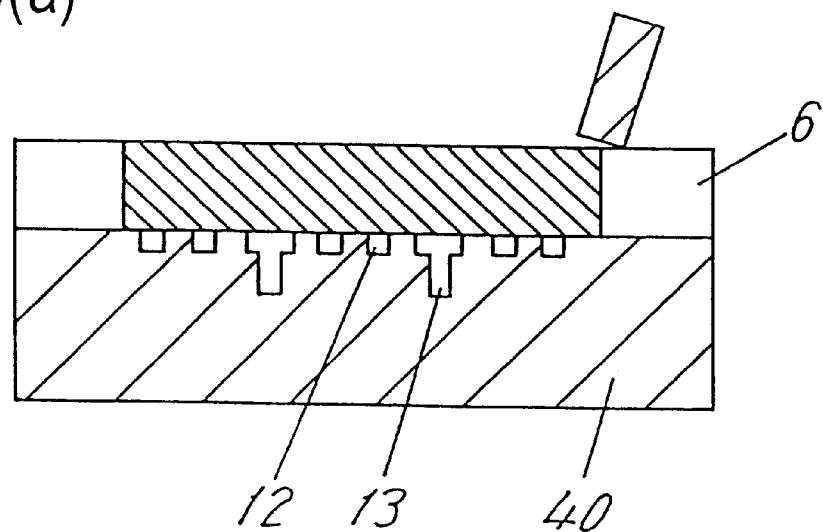
FIGS. 3(a)–(b) are sectional views showing schematically supply of paste in an intaglio by metal mask in the embodiment.
Figure 3B:
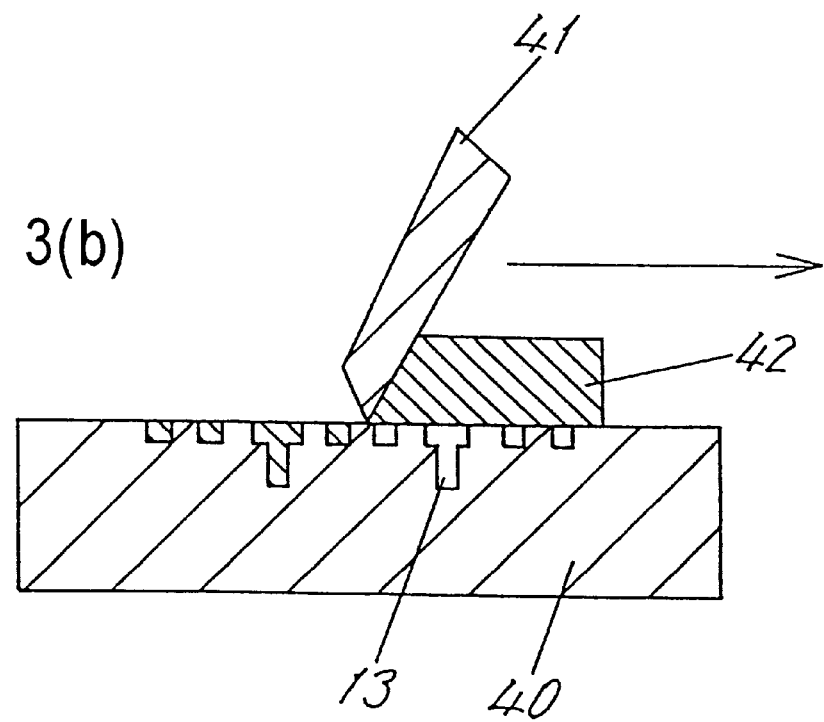

In another supply method of conductor paste 42, a metal mask 6 may be used as shown in FIGS. 3(a)–(b). The metal mask 6 can apply the conductor paste 42 uniformly in desired positions, and can change the thickness of the metal, so that the application amount can be adjusted. In the embodiment, by defining the thickness of the metal mask 6 at 150 μm, the conductor paste 42 can be supplied by 120 μ or more.

Figure 4A:
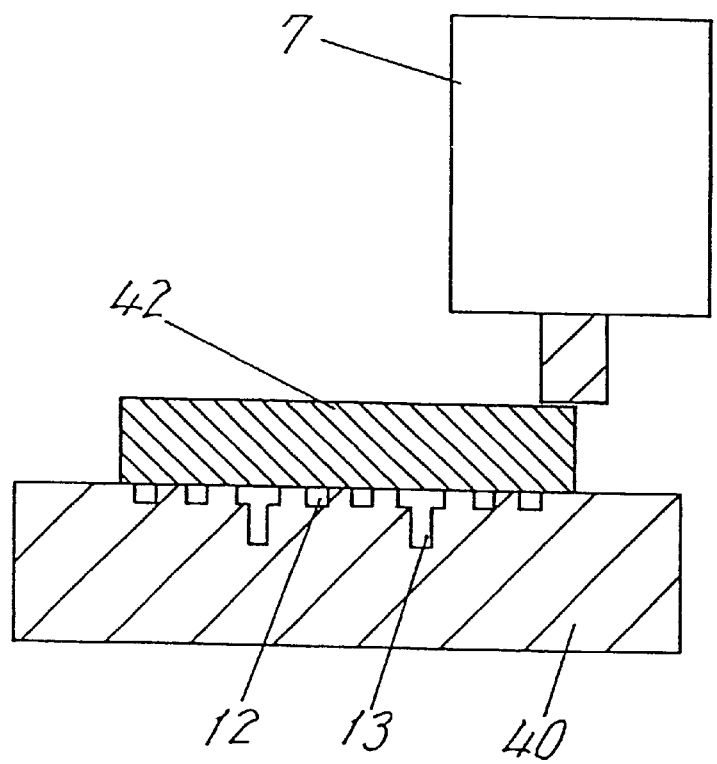
FIGS. 4(a)–(b) are sectional views showing schematically supply of paste in an intaglio by drawing device in the embodiment.
Figure 4B:
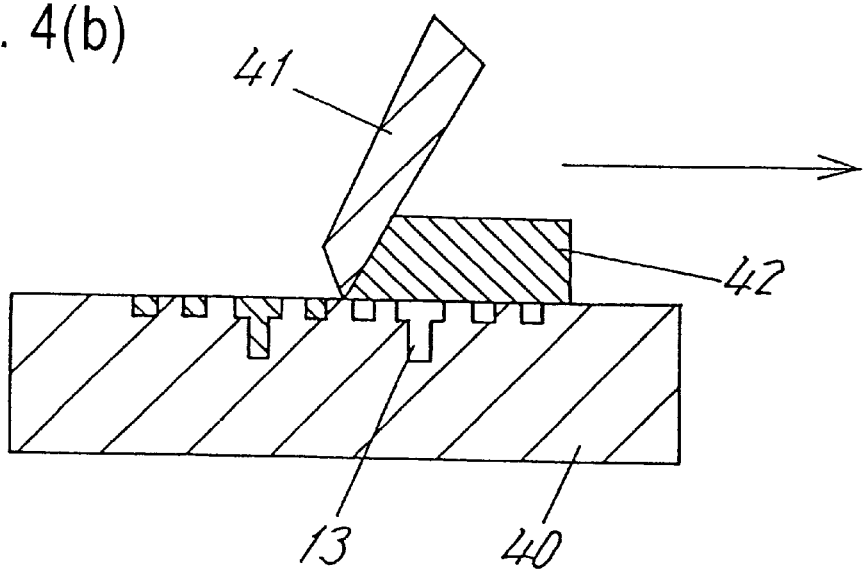

In a different supply method of conductor paste 42, as shown in FIGS. 4(a)–(b), a drawing device 7 can be used. The drawing device 7 can supply a necessary amount to necessary positions, by changing the drawing speed, the shape of the leading end, and the gap to the intaglio. Moreover, since the conductor paste 42 can be contained in an enclosed container, evaporation of the solvent in the conductor paste 42 can be prevented, and the conductor paste 42 can be supplied in a state small in time-course changes.

Figure 5A:
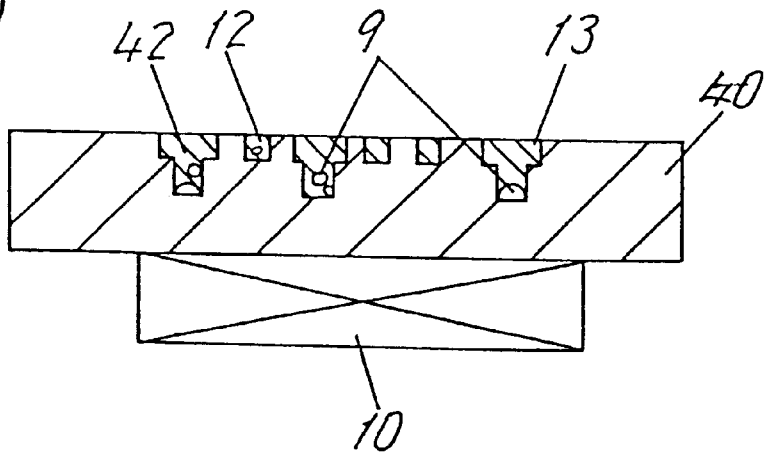
FIGS. 5(a)–(b) are sectional views showing schematically a defoaming step using an ultrasonic oscillator in the embodiment.

When attempted to fill the intaglio 40 with the conductor paste 42 by using the squeegee 41, in particular, if the width of the first and second grooves 12, 13 is narrow, or it is deep as in the case of the second groove 13, foams 9 are likely to be left over as shown in FIG. 5(a).

Figure 5B:
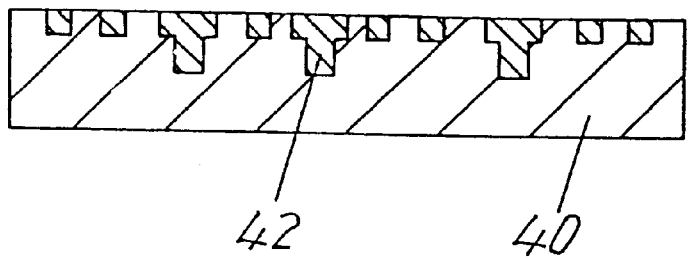

In the embodiment, the intaglio 40, which is filled with the conductor paste 42, is put on an ultrasonic oscillator 10 to defoam, and foams are removed, and then extra conductor paste 42 on the surface of the intaglio 40 is removed again by the squeegee 41, so that it can be filled with foam-free conductor paste 42 as shown in FIG. 5(b).

Defoaming by the ultrasonic oscillator 10 is effective not only after supply of the conductor paste 42 but also during filling, and the three steps of supplying, filling and defoaming may be shortened to two steps of supplying and filling.

The applied Ag—Pd paste is dried by a dryer together with the intaglio 40, and the organic solvent contained in the Ag—Pd paste is evaporated. At this time, the volume of the Ag—Pd paste applied in the first and second grooves 12, 13 is lost by the corresponding portion of evaporation of the organic solvent, and to cover up for the volume loss, the supplying, filing and defoaming, and drying steps of Ag—Pd paste are repeated. By this repetition, the thickness of the applied Ag—Pd paste after drying is set nearly same as the depth of the first and second grooves 12, 13. In this embodiment, supplying, filing, defoaming and drying were repeated three times.

Figure 6:
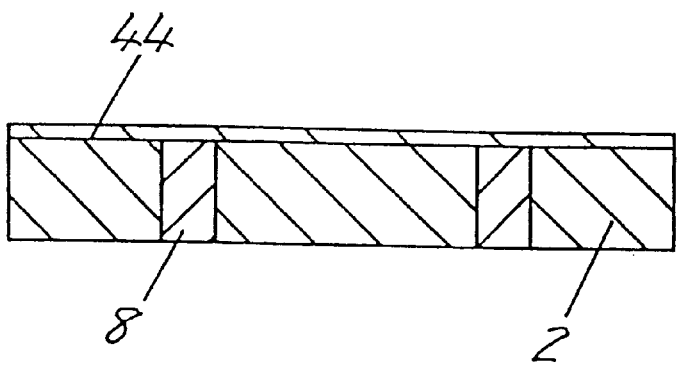
FIG. 6 is a partial sectional view after forming an adhesive layer on a ceramic substrate in the embodiment.

On the other hand, in the ceramic substrate 2, by baking after repeating filling and drying of conductor paste by screen printing in through-holes 8 as shown in FIG. 6, the through-holes 8 are nearly filled with conductor material, herein, Ag—Pd. In succession, for the ease of transfer of conductor pattern on the ceramic substrate 2, an adhesive layer 44 of thermoplastic resin or thermosetting resin is formed.

Figure 7:
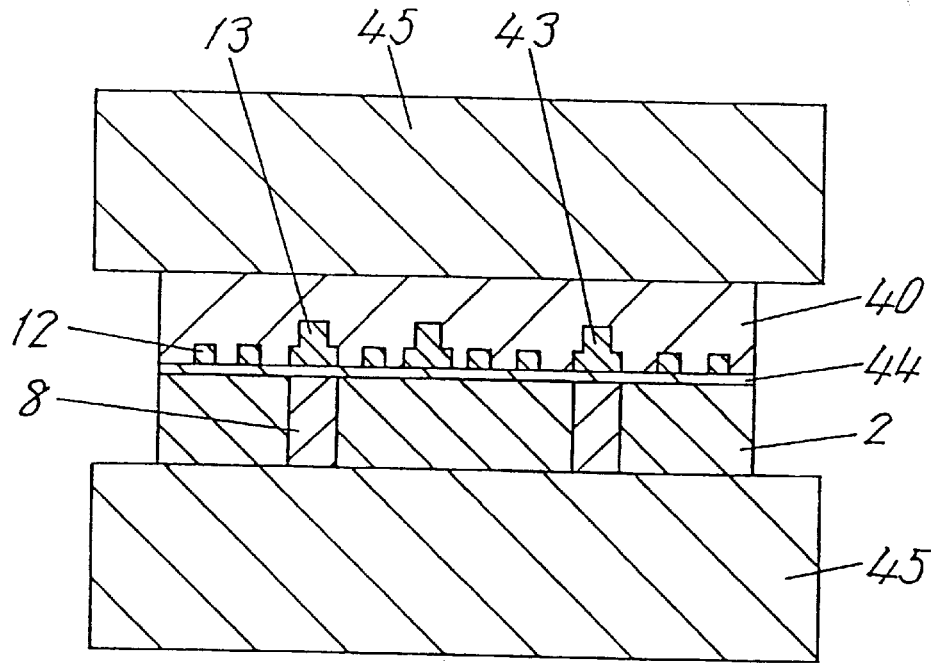
FIG. 7 is a sectional view showing schematically a laminating step of intaglio and ceramic substrate in the embodiment.

Then, as schematically shown in FIG. 7, with the adhesive layer 44 confronting the surface of the intaglio 40 of the side having the grooves 12, 13 filled with dried conductor paste 43, the intaglio 40 and ceramic substrate 2 are glued together by heating and pressing.

Herein, the ceramic substrate 2 is a baked ceramic substrate 2. As the thickness of the adhesive layer 44 increases, the conductor pattern is not formed favorably due to combustion and shrinkage force of the adhesive layer 44 itself when baking, and hence the thickness of the adhesive layer 44 is formed at 1 to 20 μm. The temperature at the gluing step is 130° C., that is, about 30° C. higher than the glass transition point of the thermoplastic resin used for the ease of transfer.

As the thermoplastic resin, a solution of butyl carbitol acetate (BCA) in which polyvinyl butyral resin (PVB) is dissolved is applied on the surf ace of the ceramic substrate 2 by spinner method, roll coater method or screen printing method, and dried, and a PVB layer of 5 μm in thickness is formed on the entire surface of the ceramic substrate 2 as an adhesive layer 44. The PVB layer may be also formed by the dipping method, and in this case, when the acetone solution with dissolved PVB is used, drying is quick as compared with the case of using BCA solution, and a uniform film thickness is obtained.

Usually, there is an undulation of about 30 μm on the surface of the ceramic substrate 2. If a non-flexible intaglio 40, for example, a glass intaglio is used, it is stiff and too large in rigidity, the intaglio 40 cannot follow up the undulated surface of the ceramic substrate 2 when adhering, and the transfer is poor, but when a flexible resin intaglio 40 as in the embodiment is used, it sufficiently follows up the undulated shape of the ceramic substrate 2, and the transfer property is much improved.

Figure 8:
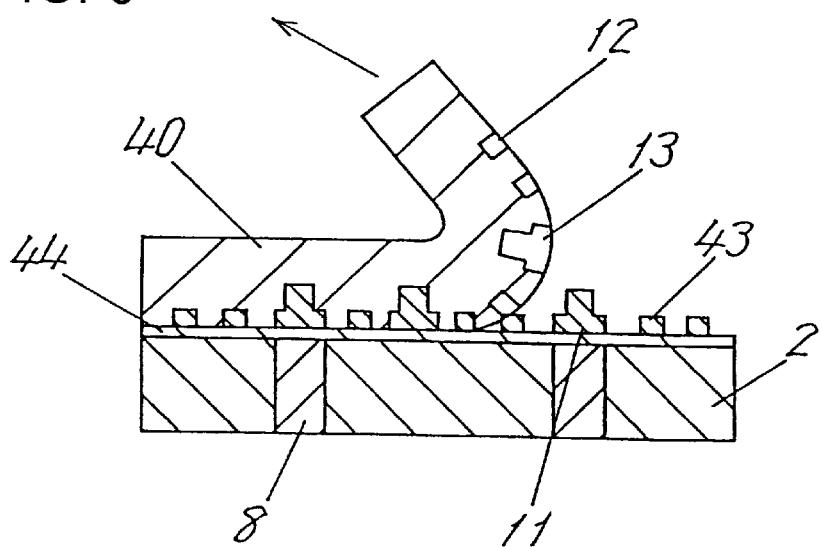
FIG. 8 is a sectional view showing schematically a parting and transferring step in the embodiment.

As shown in FIG. 8, at the transfer step, the adhered intaglio 40 and ceramic substrate 2 are lowered to room temperature, and the intaglio 40 is parted from the ceramic substrate 2, so that a dried conductor paste 43 is transferred as first conductor pattern formed in a desired wiring pattern.

At this time, since the intaglio 40 is rich in flexibility, the intaglio 40 can be bent at an angle of 90 degrees or more, and hence parting of the intaglio 40 from the ceramic substrate 2 is not planar parting as in the case of glass intaglio, but is linear parting. As a result, the force required in parting can be substantially decreased, and the intaglio 40 can be easily and securely parted, even if large in thickness.

The ceramic substrate 2 on which the dried conductor paste 43 is transferred is baked in a temperature profile with peak temperature of 850° C. Since the ceramic substrate 2 to be baked is in a structure of forming a conductor pattern through the adhesive layer 44, combustion gas from the adhesive layer 44 is generated with force from the adhesive layer 44 depending on the setting of the backing condition, and separation or deformation may occur to cause defective conductor pattern. To prevent occurrence of such defect, it is preferred to set the temperature gradient of temperature elevation from 200 to 500° C. corresponding to the temperature from start till end of combustion of the adhesive layer 44 at 200° C./hr or less.

As a result of investigation into the relation of the temperature condition and film thickness of adhesive layer 44, as far as the adhesive layer 44 is in a range of 1 to 20 μm in the above temperature condition, it is confirmed that it is free from deformation of conductor pattern and separation of conductor pattern during baking.

Figure 9:
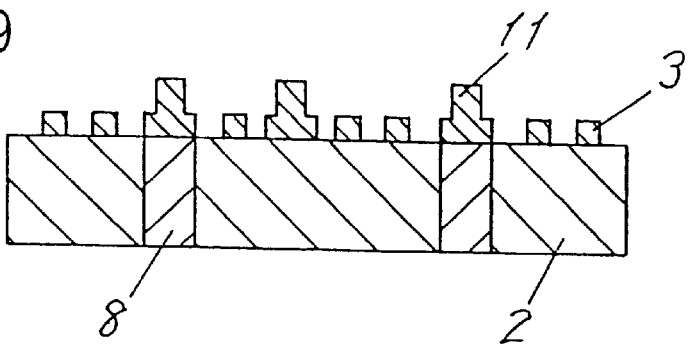
FIG. 9 is a partial sectional view after baking a conductor pattern in the embodiment.

This process, as shown in FIG. 9, has produced the first conductor pattern 3 of minimum line width of 20 μm, minimum line spacing of 40 μm, conductor film thickness after baking of 20 μm, via diameter of 100 μm, and via height of 60 μm. The electric resistance of the first conductor pattern 3 is 0.4 Ω in the maximum wire length portion, and the conductor area resistance is 2.1 mΩ, and hence a very small wiring resistance is confirmed. It is because the conductor material has shrunk due to baking that the first conductor pattern 3 is smaller than the size of the groove.

Figure 10:
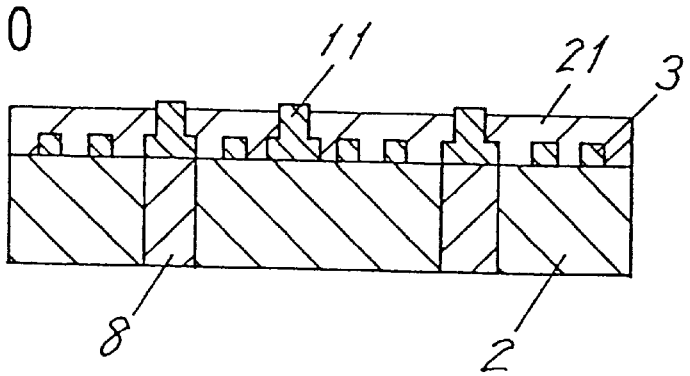
FIG. 10 is a partial sectional view after forming an insulating layer in the embodiment.

Consequently, as shown in FIG. 10, a first insulating layer 21 formed on the ceramic substrate 2 on which the first conductor pattern 3 is formed, by screen printing and baking. The material of the first insulating layer 21 is a printed paste of crystallized glass having a nearly same thermal coefficient as the ceramic substrate 2, and the first insulating layer 21 is formed on the via area by treatment without printing by emulsion of screen plate.

Figure 11:
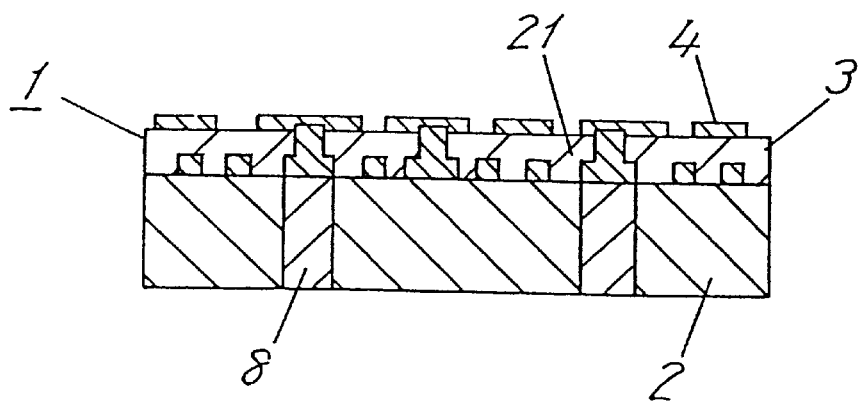
FIG. 11 is a partial sectional view after forming a second conductor pattern in the embodiment.

As shown in FIG. 11, a second conductor pattern 4 is formed on the first insulating layer 21 by printing and baking according to the screen printing rule of W/S=100 μm/100 μm. The second conductor pattern 4 and first conductor pattern 3 are electrically connected through vias 11, and a ceramic circuit board 1 is obtained.

Thus, according to the embodiment, a thick and fine wiring pattern can be easily formed, and a ceramic circuit board low in wiring resistance, high in wiring density, and high in dimensional precision of wiring pattern is obtained.

Embodiment 2

A manufacturing method of ceramic circuit board in embodiment 2 of the invention is described below while referring to the drawing.

FIGS. 12(a)–(e) are process sectional views for explaining the manufacturing method of ceramic circuit board according to this embodiment. Up to the forming step of a first conductor pattern 3 shown in FIG. 12(a), the process is same as in embodiment 1, and its explanation is omitted.

Figure 12A:
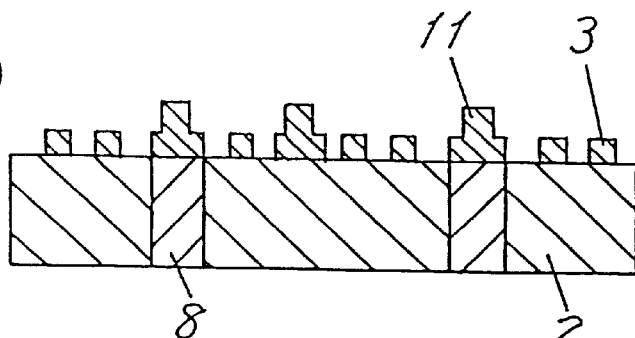
FIGS. 12(a)–(e) are process sectional views for explaining a manufacturing method of a ceramic circuit board in embodiment 2 of the invention.
Figure 12B:
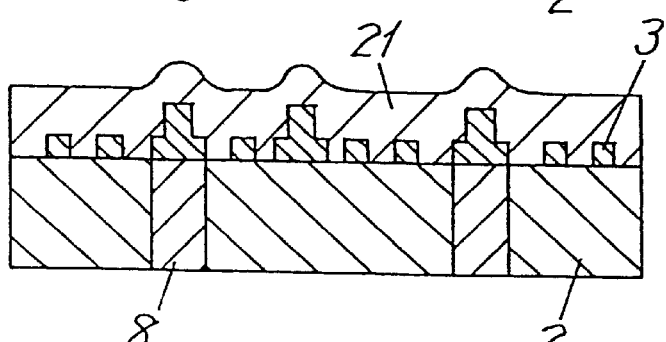
Figure 12C:
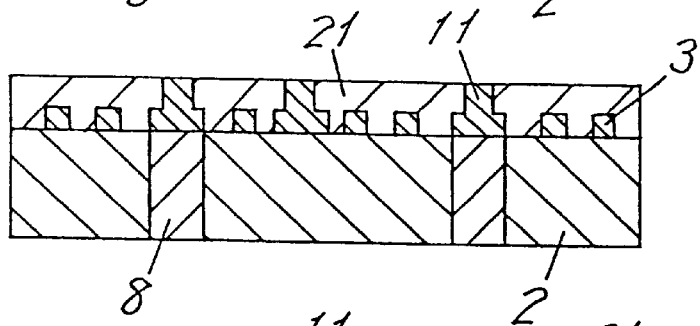

As shown in FIG. 12(b), a first insulating layer 21 formed on the first conductor pattern 3 is, different from the one in embodiment 1, formed entirely on the vias 11 by screen printing. After drying the first insulating layer 21, as shown in FIG. 12(c), the vias 11 are ground and flattened by a grinding machine until ground by about several μm, so that all necessary vias 11 are exposed from the first insulating layer 21.

Figure 12D:
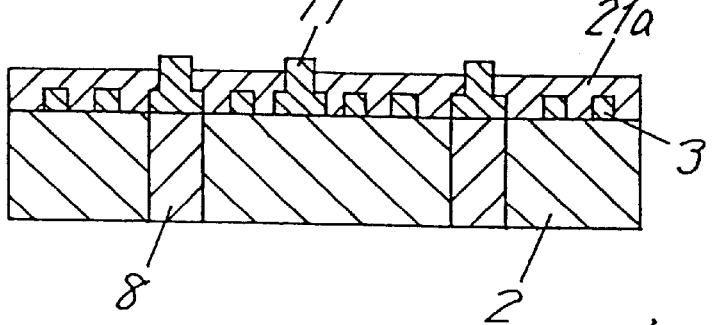

In this state, by baking in a temperature profile with peak temperature of 850° C., the first insulating layer 21a is reduced in film thickness by volume shrinkage due to baking as shown in FIG. 12(d), so that the vias 11 project about 10 μm.

Figure 12E:
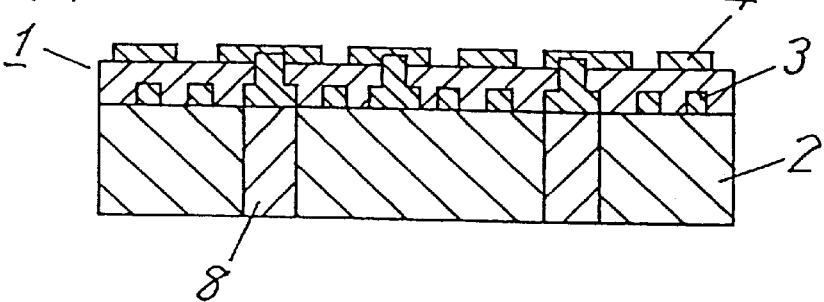

Consequently, as shown in FIG. 12(e), in the same manner as in embodiment 1, a second conductor pattern 4 is formed by printing and baking according to the screen printing rule of W/S=100 μm/100 μm. The second conductor pattern 4 and first conductor pattern 3 are electrically connected through vias 11, and a ceramic circuit board 1 is obtained.

Herein, as the via size and via pitch of the first conductor pattern 3 become smaller, it is extremely difficult in precision to form the first insulating layer 21 in a pattern not to be printed only on the vias by screen printing, and therefore by exposing the vias as in the embodiment, as far as the vias 11 can be formed in the first conductor pattern 3, the vias 11 can be exposed precisely, so that the wiring pattern and ceramic circuit board of higher density are obtained.

Embodiment 3

A manufacturing method of ceramic circuit board in embodiment 3 of the invention is described below while referring to the drawing.

FIGS. 13(a)–(d) are process sectional views for explaining the manufacturing method of ceramic circuit board according to this embodiment. Up to the forming step of a first conductor pattern 3 shown in FIG. 13(a), the process is same as in embodiment 1, and its explanation is omitted.

Figure 13A:
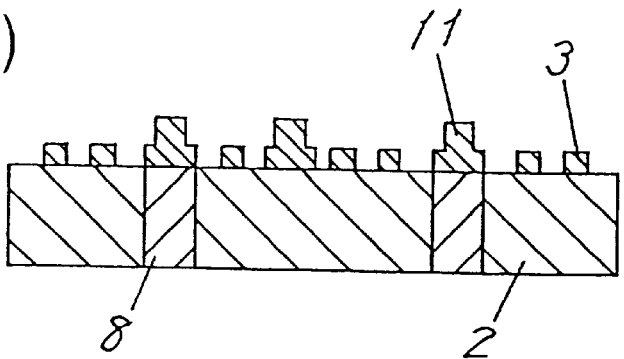
FIGS. 13(a)–(d) are process sectional views for explaining a manufacturing method of a ceramic circuit board in embodiment 3 of the invention.
Figure 13B:
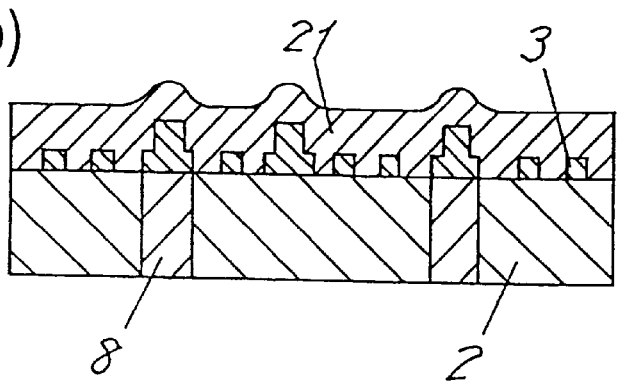

As shown in FIG. 13(b), a first insulating layer 21 formed on the first conductor pattern 3 is, different from the one in embodiment 1, formed entirely on the vias 11 by screen printing. Later, unlike embodiment 2, in this state, it is first baked in the temperature profile with peak temperature of 850° C.

Figure 13C:
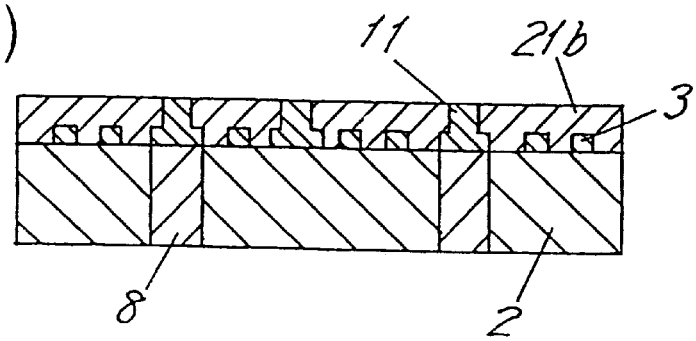

After baking, as shown in FIG. 13(c), the first insulating layer 21 is polished by a polishing machine, and polished and flattened until all vias 11 are completely exposed, so that a first insulating layer 21b is formed.

Figure 13D:
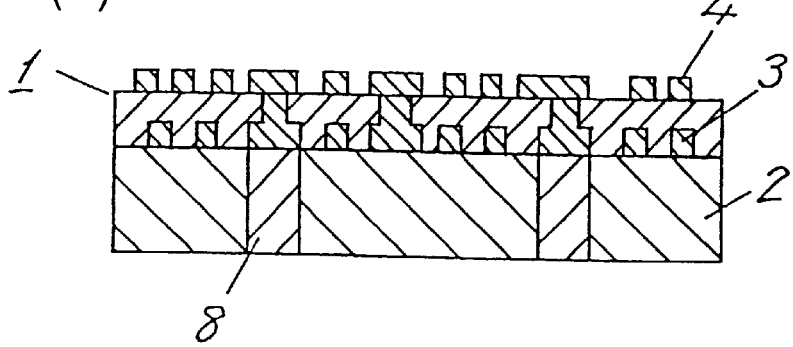

To form a second conductor pattern 4, an adhesive layer (not shown) is applied on the surface of the substrate obtained at in FIG. 13(c), and in the same process as the forming step of the first conductor pattern 3, it is transferred and formed by the intaglio forming a second conductor pattern 4, and the second conductor pattern 4 is formed as in FIG. 13(d), and the second conductor pattern 4 and first conductor pattern 3 are connected electrically through the vias 11, and a ceramic circuit board 1 is obtained. Incidentally, the wiring rule of the second conductor pattern 4 is exactly same as the wiring rule of the first conductor pattern 3.

According to the embodiment, as far as the vias 11 can be formed by the first conductor pattern 3, the vias 11 can be exposed precisely, and further the height of the vias 11 and the height of the first insulating layer 21b are on the same plane, and an excellent flatness is obtained, and therefore when transferring and forming the second conductor pattern 4 by the intaglio, it is particularly effective, and the wiring pattern and ceramic circuit board of higher density are obtained.

Embodiment 4

A manufacturing method of ceramic circuit board in embodiment 4 of the invention is described below while referring to the drawing.

FIGS. 14(a)–(f) are process sectional views for explaining the manufacturing method of ceramic circuit board according to this embodiment. Up to the forming step of a first insulating layer 21a shown in FIG. 14(a) to (d), the process is same as in embodiment 2, and its explanation is omitted.

Figure 14A:
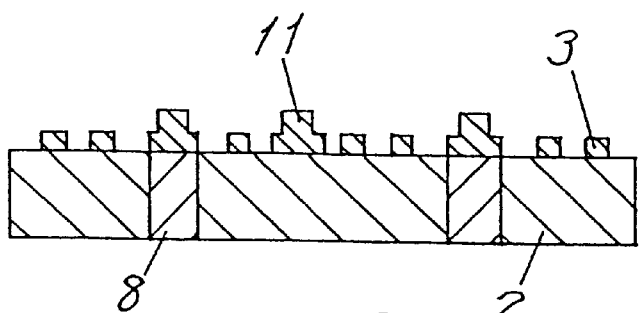
FIGS. 14(a)–(f) are process sectional views for explaining a manufacturing method of a ceramic circuit board in embodiment 4 of the invention.
Figure 14B:
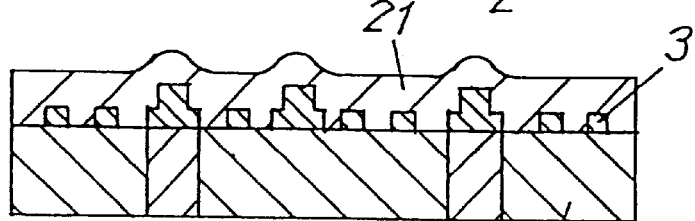
Figure 14C:
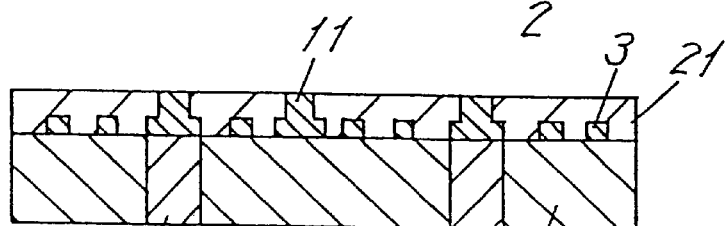
Figure 14D:
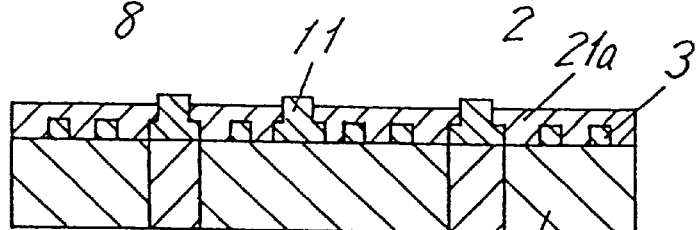
Figure 14E:
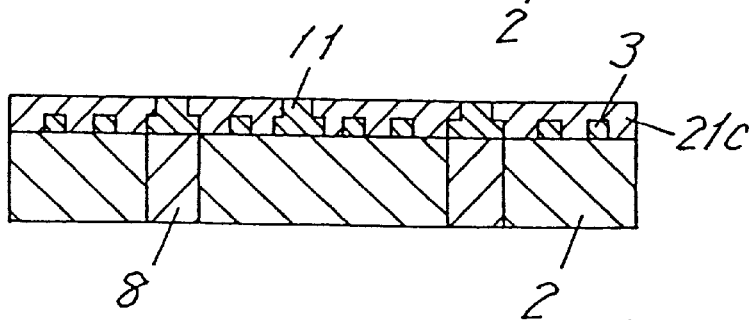

As shown in FIG. 14(e), in order to align the height of the vias 11 with the height of the first insulating layer 21a, only the vias 11 are polished by a polishing machine, so that the height of the vias 11 and the height of the first insulating layer 21d are on the same plane.

Figure 14F:
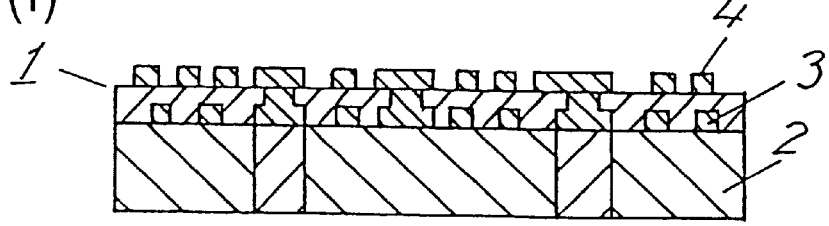

As shown in FIG. 14(f), same as FIG. 13(d) in embodiment 3, an adhesive layer (not shown) is applied on the surface of the substrate obtained at step FIG. 14(e), and in the same process as the forming step of the first conductor pattern 3, it is transferred and formed by the intaglio forming a second conductor pattern 4, and the second conductor pattern 4 is formed. The second conductor pattern 4 and first conductor pattern 3 are connected electrically through the vias 11, and a ceramic circuit board 1 is obtained. Incidentally, the wiring rule of the second conductor pattern 4 is exactly same as the wiring rule of the first conductor pattern 3.

Thus, according to the embodiment, although polishing or grinding process is required twice, the first grinding process is grinding of dry film of the insulating layer 21, it can be ground very easily in a short time, and the second polishing process is only polishing of exposed portion of the vias 11, and this polishing is also very easy and short in time.

Embodiment 5

A manufacturing method of ceramic circuit board in embodiment 5 of the invention is described below while referring to the drawing.

FIGS. 15(a)–(d) are process sectional views for explaining the manufacturing method of ceramic circuit board according to this embodiment.

Figure 15A:
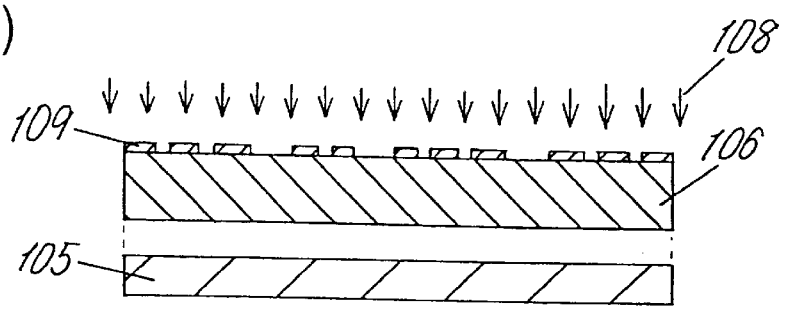
FIGS. 15(a)–(d) are process sectional views for explaining a manufacturing method of a ceramic circuit board in embodiment 5 of the invention.

First, as shown in FIG. 15(a), a polyimide film 105 which is a flexible resin base material of 125 μm in thickness and a glass mask 106 forming a desired wiring pattern 109 are positioned, and a laser beam 108 of wavelength of 248 nm in an ultraviolet region is emitted by using an excimer laser apparatus (not shown).

Figure 15B:
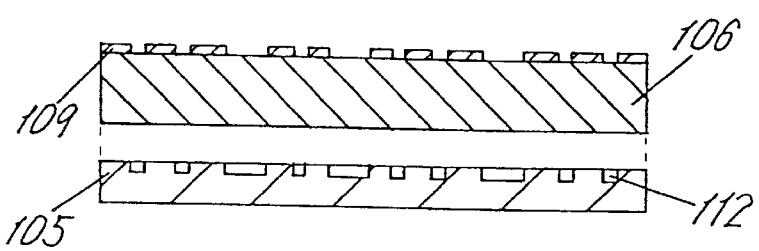

Next, as shown in FIG. 15(b), the portion irradiated with the excimer laser 108 is decomposed by photochemical reaction, and a first groove 112 is processed. In this embodiment, the first groove 112 is the portion corresponding to the line of the first conductor pattern is 25 μm in width and 30 μm in depth. The portion for processing a second groove 113 later is 150 μm in diameter.

Figure 15C:
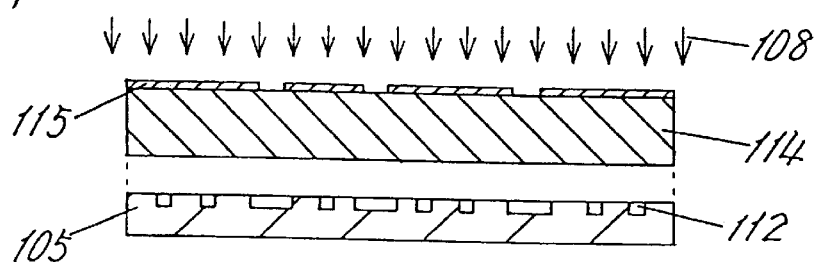

As shown in FIG. 15(c), the polyimide film 105 processing the first groove 112 and a glass mask 114 forming a desired wiring pattern 115 are positioned, and irradiated with laser beam 108 in the same manner as in FIG. 15(a).

Figure 15D:
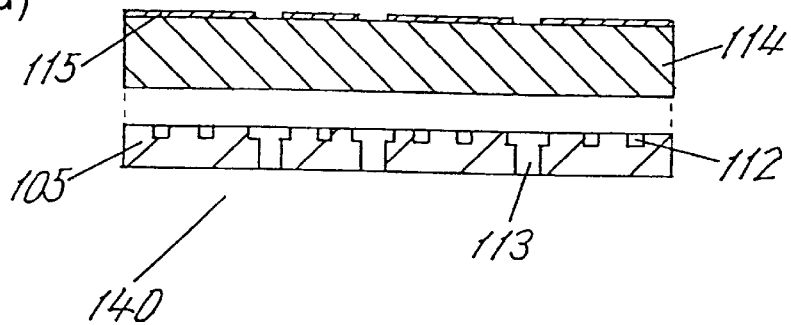

As shown in FIG. 15(d), same as in FIG. 15(b), the portion irradiated with the excimer laser 108 is processed into a second groove 113. In this embodiment, the diameter of the deepest portion of the second groove 113 corresponding to vias 111 is 120 μm, and the depth is 90 μm. At this time, the second groove 113 is partly overlapped with the first groove 112, and the overlapping portion of the first groove 112 and second groove 113 is formed to penetrate through the face and back surfaces of the polyimide film 105. The first groove 112 and second groove 113 are processed so that the surface shape and the deepest portion shape may be either same or become smaller as going deeper.

As the flexible resin base material, any material can be used as far as it is decomposed by photochemical reaction in the case of excimer laser processing, but polyethylene terephthalate (PET) or polyether imide (PEI) may be also used. However, the polyimide film used as the material for the intaglio 140 is not sufficient in the parting property between the film and the conductor paste 142 applied and transferred in the grooves 112, 113. As a result, the conductive paste 142 is likely to be left over inside of the grooves 112, 113 at the transfer step. Accordingly, a parting layer (not shown) is formed on the surface of the intaglio 140, in particular, on the surface of the grooves 112, 113. As the parting layer, a fluorocarbon monomolecular film is used.

Figure 16:
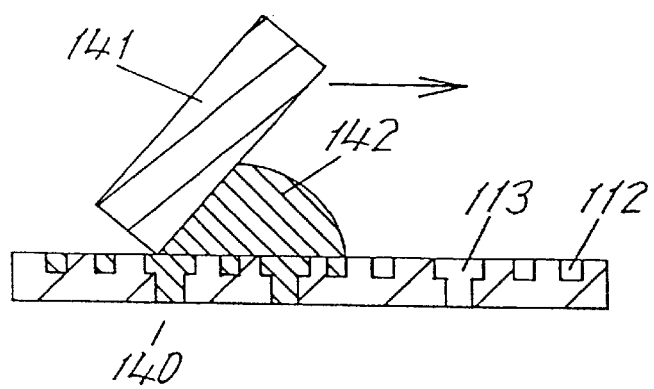
FIG. 16 is a sectional view showing schematically the filling step of conductive paste in an intaglio in the embodiment.

Next, as shown in FIG. 16, on the surface of the intaglio 140 forming the parting layer, Ag/Pd paste is applied as conductor paste 142. By scratching the surface of the intaglio 140 after application by means of a squeegee 141, the extra Ag/Pd paste on the surface of the intaglio 140 is removed, while the grooves 112, 113 are sufficiently filled with Ag/Pd paste. At this time, since the second groove 113 penetrates through the face and back surfaces of the intaglio 140, when filling with the conductor paste 142, it is required to protect the back surface of the intaglio 140 from contamination by the conductor paste 142 by laying, for example, a sheet of polyimide film (not shown) on the back surface of the intaglio.

The applied Ag/Pd paste is dried, together with the intaglio 140, by a dryer, and the organic solvent in the Ag/Pd paste is evaporated. As a result, the volume of the Ag/Pd paste applied in the grooves 112, 113 is decreased by the portion corresponding to the volatile content of the organic solvent. To cover up for the volume loss, the filling and drying steps of Ag/Pd paste are repeated. By this repetition, the dried thickness of the applied Ag/Pd paste can be made nearly equal to the depth of the grooves 112, 113. In the embodiment, filling and drying were repeated three times.

Figure 17A:
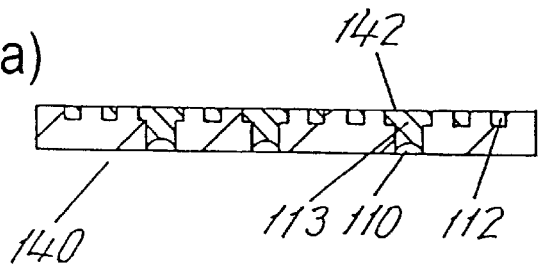
FIGS. 17(a)–(b) are process sectional views showing schematically a filling step of conductive paste in an intaglio in the embodiment.
Figure 17B:
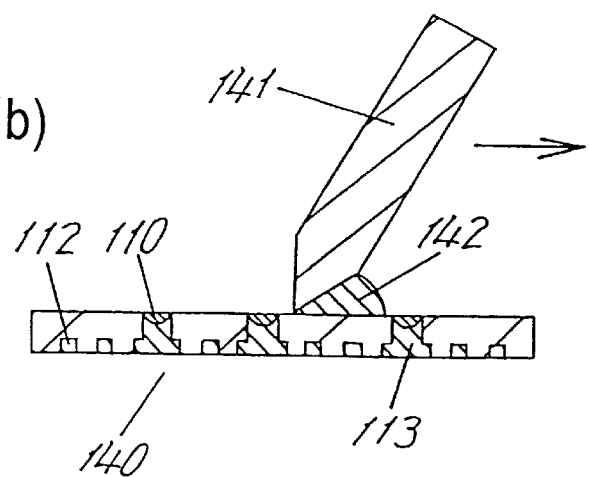

At this time, by filling and drying by using the intaglio 140 with the penetrating groove, the groove 113 can be sufficiently filled with the conductor paste 142 without admitting foams. However, as shown in FIG. (17(a)), since the second groove 113 penetrates through, at the drying step of the conductor paste 142, the conductor paste 142 at the penetration side also shrinks, and the volume of the conductor paste 142 in the second groove 113 is not constant. Accordingly, as shown in FIG. 17(b), after drying the conductor paste 142, the conductor paste 142 is applied from the back side of the intaglio 140, and dried further, so that the second groove 113 can be also filled sufficiently with the conductor paste 142, and the filling amount is constant.

Figure 18:
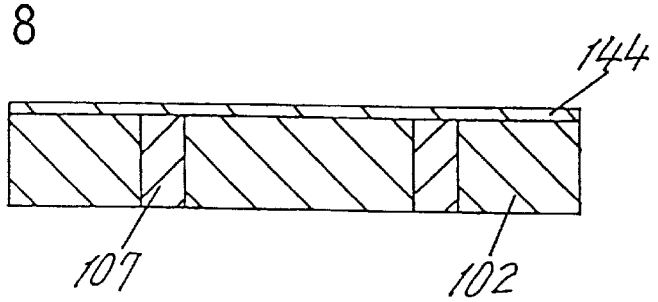
FIG. 18 is a partial sectional view after forming an adhesive layer on a ceramic substrate in the embodiment.

In the ceramic substrate 2, as shown in FIG. 18, a through-hole 107 is completely filled with conductive material, or Ag/Pd in this case, by applying, drying and baking the conductor paste repeatedly by screen printing.

Figure 19:
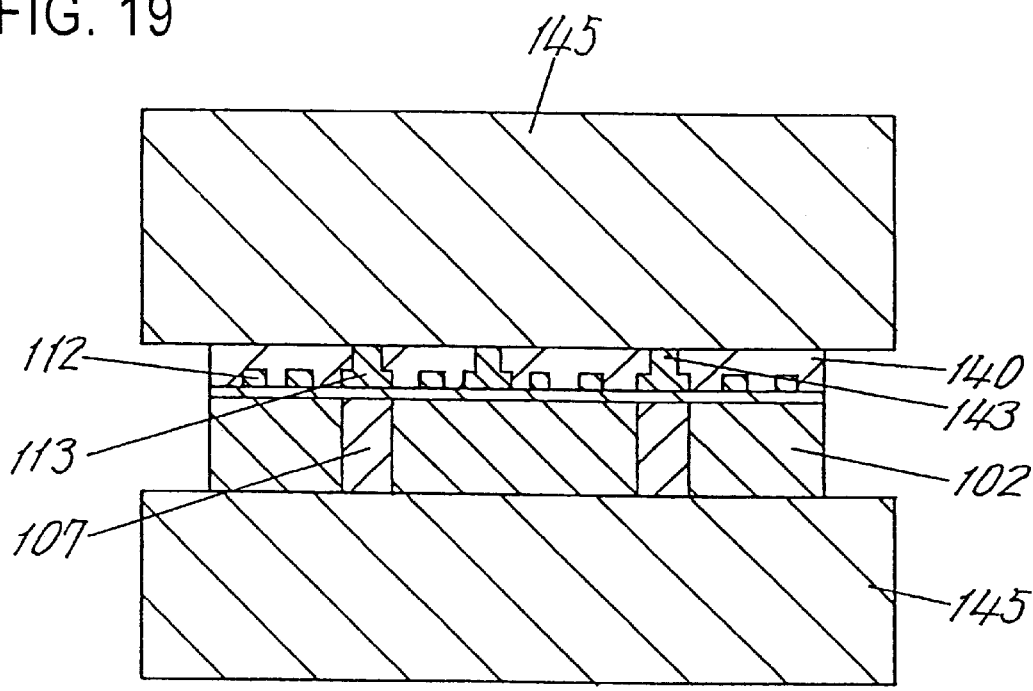
FIG. 19 is a sectional view showing schematically a laminating step of intaglio and ceramic substrate in the embodiment.

In succession, for the ease of transfer of conductor pattern on the ceramic substrate 102, an adhesive layer 44 of thermoplastic resin is formed. As shown in FIG. 19, the surface of the intaglio 140 at the side having the grooves 112, 113 filled with dried conductor paste 143 is set opposite to the adhesive layer 144, and the intaglio 140 and ceramic substrate 102 are adhered by heating and pressing with a press tool 145. Herein, as the ceramic substrate 102, a baked ceramic substrate 102 is used. As the thickness of the adhesive layer 144 increases, the conductor pattern 142 may not be formed favorably due to baking and shrinking force of the adhesive layer 144 itself at the time of baking. To solve this problem, it is known that the thickness of the adhesive layer 144 should be 1 to 20 μm.

The temperature at baking step is 130° C. This temperature is about 30° C. higher than the glass transition point of the thermoplastic resin being used, and it has been confirmed to be excellent in transfer property. The thermoplastic resin is a solution of butyl carbitol acetate (BCA) in which polyvinyl butyral resin (PVB) is dissolved, which is applied and dried on the surface of the ceramic substrate 102 by dipping method. Thus, a PVB layer of 5 μm in thickness is formed on the entire surface of the ceramic substrate 102 as an adhesive layer 144. Aside from the dipping method, the PVB layer may be also applied by the spinner method, roll coater method, or screen printing method.

Usually, there is an undulation of about at least 30μm on the surface of the ceramic substrate 102. If a non-flexible intaglio, for example, a glass intaglio is used, it is stiff and too large in rigidity, the intaglio cannot follow up the undulated shape of the substrate when adhering, but when a flexible resin-made intaglio 140 as in the invention is used, it sufficiently follows up the undulated shape of the substrate, and the manufacturing method of an excellent transfer property is realized.

Figure 20:
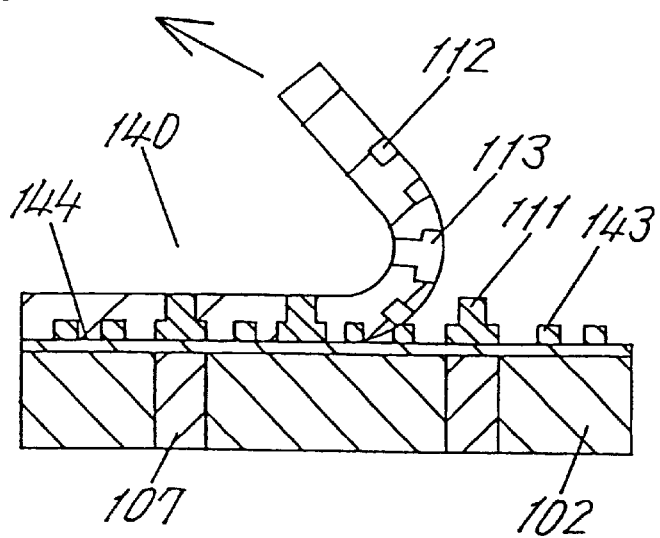
FIG. 20 is a sectional view showing schematically a parting and transferring step in the embodiment.

At the transfer step, the adhered intaglio 140 and ceramic substrate 102 are lowered to room temperature, and the intaglio 140 is parted from the ceramic substrate 102, so that a dried conductor paste 143 is transferred as first conductor pattern formed depending on a wiring pattern. At this time, as shown in FIG. 20, since the intaglio 140 is rich in flexibility, the intaglio 140 can be bent at an angle of 90 degrees or more. As a result, since parting of the intaglio 140 from the ceramic substrate 102 is linear parting, the force required in parting is decreased, and the intaglio 140 can be easily and securely parted.

The ceramic substrate 102 on which the dried conductor paste 143 is transferred is baked in a temperature profile with peak temperature of 850° C. Since the ceramic substrate 102 to be baked is in a structure of forming a conductor pattern through the adhesive layer 144, combustion gas from the adhesive layer 144 is generated with force from the adhesive layer 144 depending on the setting of the backing condition, and separation or deformation may occur to cause defective conductor pattern. To prevent occurrence of such defect, it is preferred to set the temperature gradient of temperature elevation from 200 to 500° C. corresponding to the temperature from start till end of combustion of the adhesive layer 144 at 200° C./hr or less.

Figure 21:
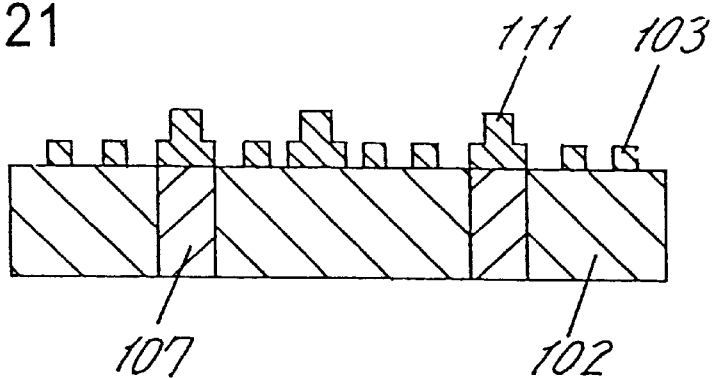
FIG. 21 is a partial sectional view after baking of conductor pattern in the embodiment.

As a result of investigation into the relation of the temperature condition and film thickness of adhesive layer, as far as the adhesive layer 144 is in a range of 1 to 20 μm in the above temperature condition, it is confirmed that it is free from deformation of conductor pattern and separation of conductor pattern during baking. This process has produced the first conductor pattern 103 of minimum line width of 20 μm and via height of 60 μm as shown in FIG. 21. It is because the conductor material has shrunk due to baking that it is smaller than the size of the groove.

The electric resistance of the first conductor pattern 103 is 0.4Ω in the maximum wire length portion, and the conductor area resistance is 2.1 mΩ, and hence a very small wiring resistance is confirmed.

Figure 22:
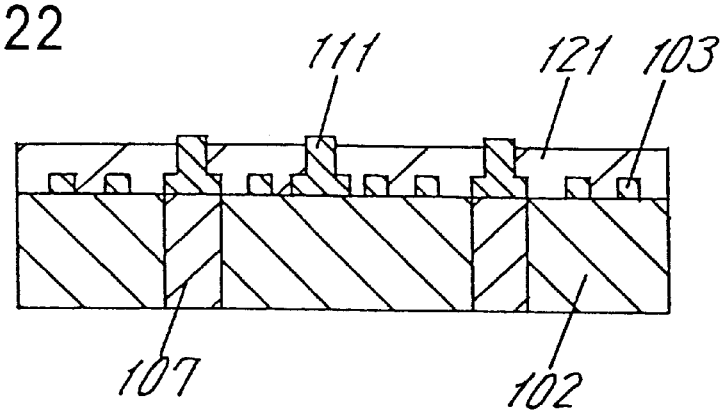
FIG. 22 is a partial sectional view after forming of laminated layer in the embodiment.

Consequently, as shown in FIG. 22, an insulating layer 121 formed on the ceramic substrate 102 on which the first conductor pattern 103 is formed, by screen printing and baking. The material of the insulating layer 121 is a printed paste of crystallized glass having a nearly same thermal coefficient as the ceramic substrate 102. The upper part of the vias 111 has a pattern formed so as not to be printed by emulsion of screen plate.

Figure 23:
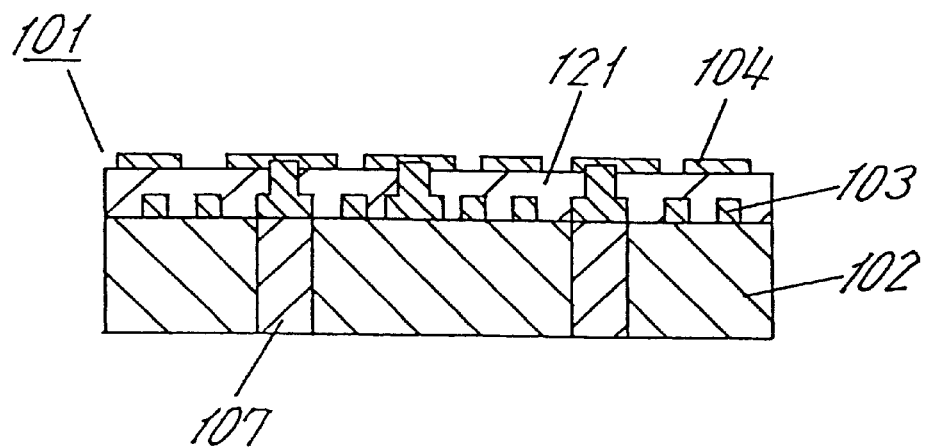
FIG. 23 is a partial sectional view after forming of a second conductor pattern in the embodiment.
Figure 24A:
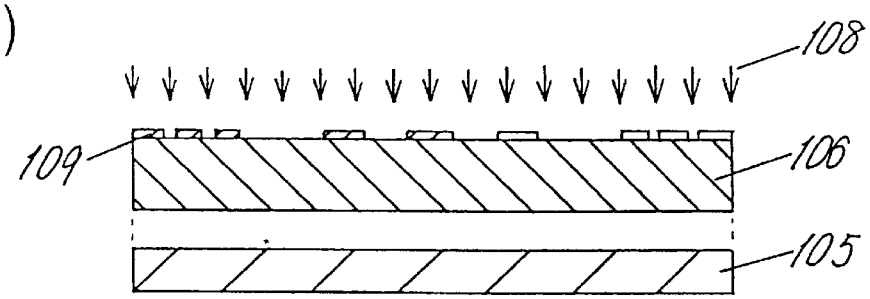
FIGS. 24(a)–(d) are process sectional views for explaining a manufacturing method of a ceramic circuit board in embodiment 6 of the invention.
Figure 24B:
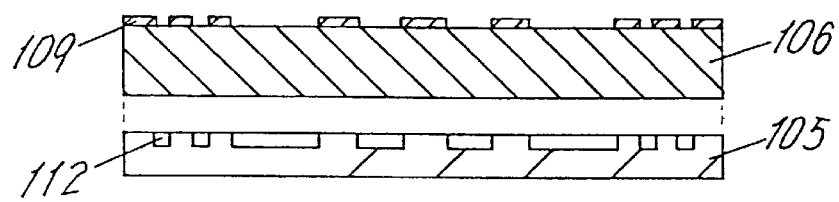
Figure 24C:
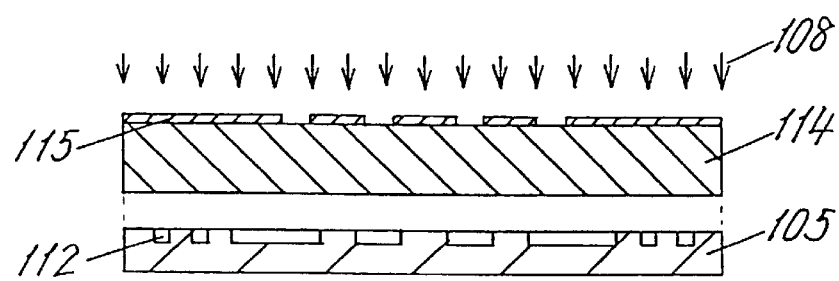
Figure 24D:
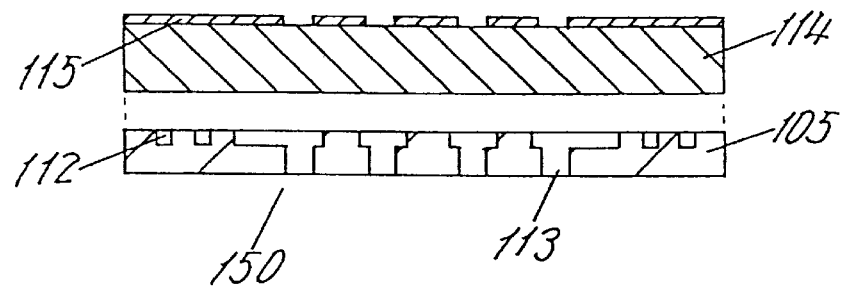

As shown in FIG. 23, a second conductor pattern 104 is formed on the insulating layer 121 by printing and baking according to the screen printing rule of W/S=100 μm/100 μm. The second conductor pattern 104 and first conductor pattern 103 are electrically connected through vias 111.

Thus, according to the embodiment, the overlapped portion of the first groove 112 and second groove 113 penetrates through the face and back surfaces of the intaglio 140, and foams can be expelled from the back surface when filling with conductive paste 142, so that the grooves 112, 113 can be completely filled with the conductive paste 142. Therefore, the vias 111 free from fluctuations in height can be formed, and the first conductor pattern 103 and second conductor pattern 104 can be electrically connected through the vias 111, so that defective conduction due to disconnection can be suppressed.

Embodiment 6

A chip size package (CSP) using a ceramic substrate in embodiment 6 of the invention is described below while referring to the drawing.

FIG. 24 is a process sectional view for explaining the manufacturing method of ceramic circuit board according to this embodiment, and the same steps as in embodiment 5 are identified with same reference numerals, and their explanation is omitted.

FIG. 24 particularly shows the processing steps of intaglio, and the processing method is the same method as in embodiment 5. The base material of an intaglio 150 is a polyimide film of 125 μm in thickness. In this intaglio 150, too, a second groove 113 is disposed to overlap partly with a first groove 112, and the overlapping portion of the first groove 112 and second groove 113 penetrates through the face and back surfaces of the intaglio 150. The second groove 113 is arranged to coincide with an electrode pattern 154 of an LSI chip 153.

In the embodiment, the width of the first groove 112 corresponding to a wiring pattern 151 is 50 μm, the depth is 30 μm, and the diameter of the deepest portion of the second groove 113 corresponding to a bump 152 is 100 μm. On the surface of the intaglio 150, particularly on the surface of the first and second grooves 112, 113, a parting layer (not shown) is formed, and as conductor paste 142, in the same manner as in FIG. 16, Ag/Pd paste is applied and dried on the intaglio 150.

Consequently, same as in the process shown in FIG. 17 to FIG. 21, the wiring pattern 151 corresponding to the first groove 112 and the bump 152 corresponding to the second groove 113 are formed on the ceramic substrate 102. In this process, the pattern shape of 40 μm in line width and 60 μm in bump height is obtained. It is smaller than the groove size because the conductor material has shrunk by baking.

Figure 25:
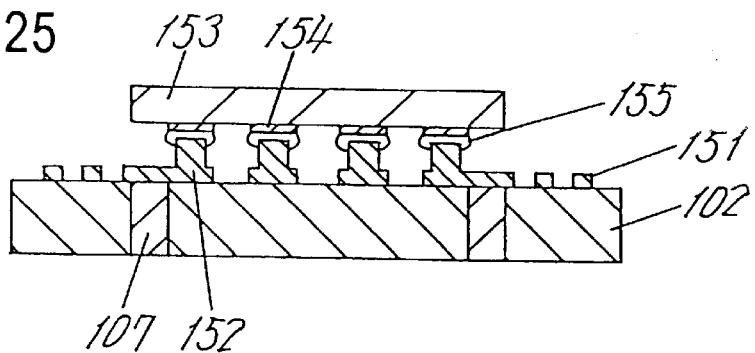
FIG. 25 is a partial sectional view when forming CSP in the embodiment.

As shown in FIG. 25, the LSI chip 153 is mounted face down on the substrate with bump 152. At this time, an electrode 154 of the LSI chip 153 and the bump 152 are electrically connected through a conductive resin 155. In another method, solder may be used instead of the conductive resin 155.

In the CSP using thus formed ceramic substrate, in spite of the flip chip mounting method, it is not required to form the bump 152 at the LSI chip 153 side, and the bump 152 and wiring pattern 151 can be formed in batch at the ceramic substrate 102 side, so that the CSP may be made at a lower cost. Moreover, since the portion of the intaglio 150 corresponding to the bump 152 forms a penetration, entry of foams can be prevented at the step of filling the intaglio 150 with conductor paste 142. Hence the conductor paste 142 applied in the intaglio 150 forms a dense film, and height fluctuations of the bumps 152 or defective transfer can be prevented, and a secure electric conduction between the bump 152 and LSI chip 153 is assured by the conductive resin 155.

Embodiment 7

A chip size package (CSP) using a ceramic substrate in embodiment 7 of the invention is described below while referring to the drawing.

FIGS. 26(a)–(d) are process sectional views for explaining the manufacturing method of ceramic circuit board according to this embodiment, and the same steps as in embodiment 5 are identified with same reference numerals, and their explanation is omitted.

FIGS. 26(a)–(d) particularly show the processing steps of intaglio, and the processing method is the same method as in embodiment 5. The base material of an intaglio 160 is a polyimide film of 125 μm in thickness. In this intaglio 160, a second groove 113 is disposed to cover a part of a first groove 112, and the overlapping portion of the first groove 112 and second groove 113 penetrates through the face and back surfaces of the intaglio 160. This penetration portion is arranged to coincide with an electrode pattern 154 of an LSI chip 153.

In the embodiment, the width of the first groove 112 corresponding to a wiring pattern 161 is 50 μm, the depth is 30 μm, and the diameter of the deepest portion of the second groove 113 corresponding to a bump 162 is 120 μm. The diameter of the first groove 112 corresponding to the head of the bump 162 is 50 μm. On the surface of the intaglio 160, particularly on the surface of the first and second grooves 112, 113, a parting layer (not shown) is formed, and as conductor paste 142, in the same manner as in FIG. 16, Ag/Pd paste is applied and dried on the intaglio 160.

Consequently, same as in the process shown in FIG. 17 to FIG. 21, the wiring pattern 161 and the bump 162 are formed on the ceramic substrate 102. In this process, the pattern shape of 40 μm in line width, 60 μm in bump height, and 40 μm in bump head diameter is obtained. It is smaller than the groove size because the conductor material has shrunk by baking.

Figure 27:
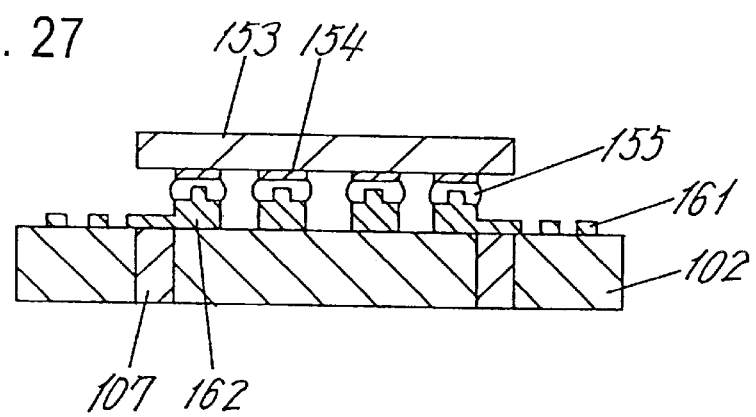
FIG. 27 is a partial sectional view when forming CSP in the embodiment.

As shown in FIG. 27, the LSI chip 153 is mounted face down on the substrate with bump 162. At this time, an electrode 154 of the LSI chip 153 and the bump 162 are electrically connected through a conductive resin 155. In other method, solder may be used instead of the conductive resin 155.

In the CSP using thus formed ceramic substrate, same as in embodiment 6, the bump 162 and wiring pattern 161 can be formed in batch at the ceramic substrate 102 side. Further, since the shape of the bump head is convex, the conductive resin 155 is easily applied on the bumps 162, and since the conductive resin 155 is applied only on the head of the bumps 162, it is free from short-circuiting of adjacent bumps 162 due to excessive application of conductive resin 155.

Embodiment 8

A chip size package (CSP) using a ceramic substrate in embodiment 8 of the invention is described below while referring to the drawing.

FIGS. 28(a)–(f) are process sectional views for explaining the manufacturing method of ceramic circuit board according to this embodiment, and the same steps as in embodiment 5 are identified with same reference numerals, and their explanation is omitted.

FIGS. 28(a)–(f) particularly show the processing steps of intaglio, and the processing method is the same method as in embodiment 5, except that the groove corresponding to a bump 172 is formed in three steps. The base material of an intaglio 170 is a polyimide film of 125 μm in thickness. In this intaglio 170, a second groove 113 is disposed to overlap partly with a first groove 112, and a third groove 118 formed in the second groove 113. The overlapping portion of the first groove 112, second groove 113 and third groove 118 penetrates through the face and back surfaces of the intaglio 170. This penetration portion is arranged to coincide with an electrode pattern 54 of an LSI chip 53.

In the embodiment, the width of the first groove 112 corresponding to a wiring pattern 171 is 50 μm, the depth is 30 μm, the diameter of the deepest portion of the first groove 112 corresponding to the bump 172 is 120 μm, the diameter of the deepest portion of the second groove 113 is 90 μm, and the diameter of the deepest portion of the third groove 118 is 50 μm. On the surface of the intaglio 170, particularly on the surface of the first and second grooves 112, 113, a parting layer (not shown) is formed, and as conductor paste 142, in the same manner as in FIG. 16, Ag/Pd paste is applied and dried on the intaglio 170.

Consequently, same as in the process shown in FIG. 17 to FIG. 21, the wiring pattern 171 and the bump 172 are formed on the ceramic substrate 102. In this process, the wiring pattern with stepped bump of 40 μm in line width, 60 μm in bump height, and 40 μm in bump head diameter is obtained. It is smaller than the groove size because the conductor material has shrunk by baking.

Figure 29:
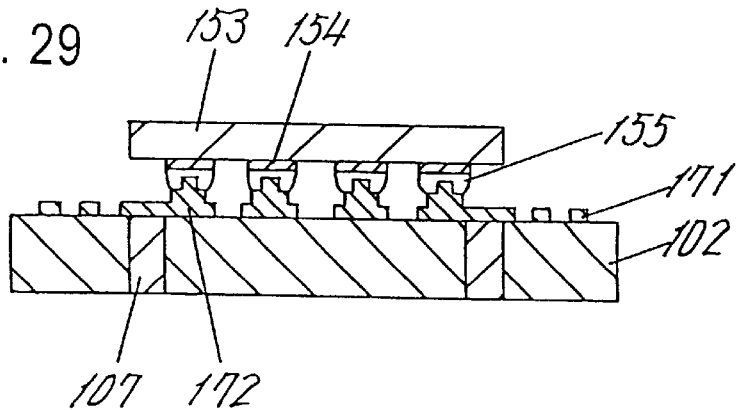
FIG. 29 is a partial sectional view when forming CSP in the embodiment.
Figure 26A:
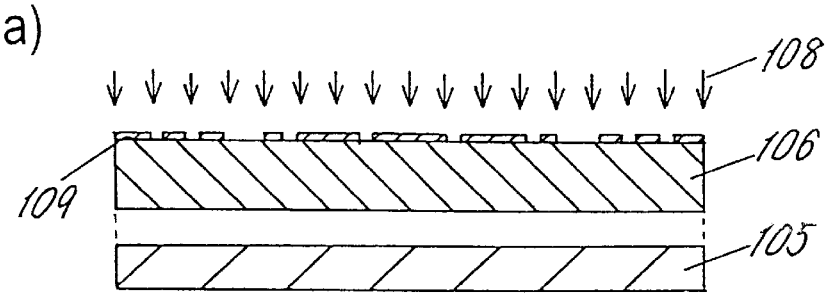
FIGS. 26(a)–(d) are process sectional views for explaining a manufacturing method of a ceramic circuit board in embodiment 7 of the invention.
Figure 26B:
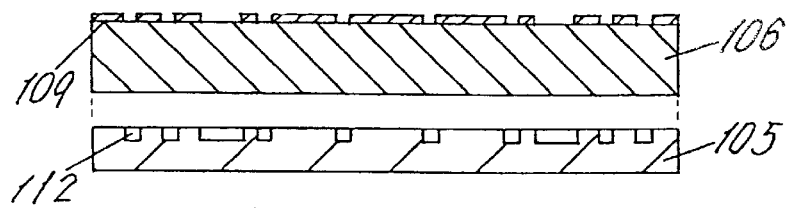
Figure 26C:
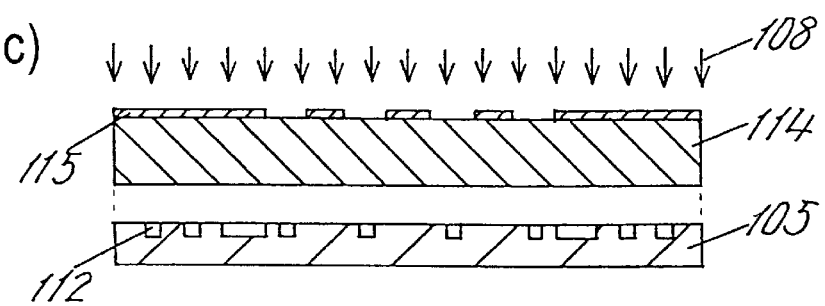
Figure 26D:
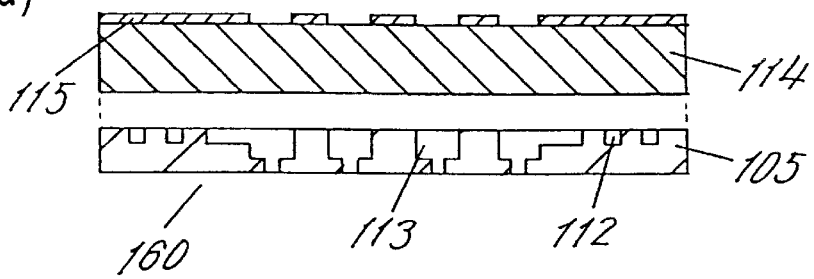
Figure 28A:
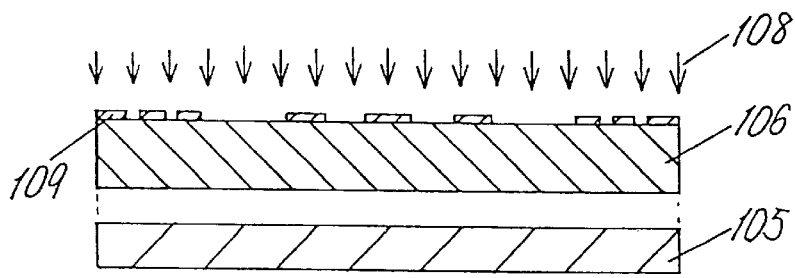
FIGS. 28(a)–(f) are process sectional views for explaining a manufacturing method of a ceramic circuit board in embodiment 8 of the invention.
Figure 28B:
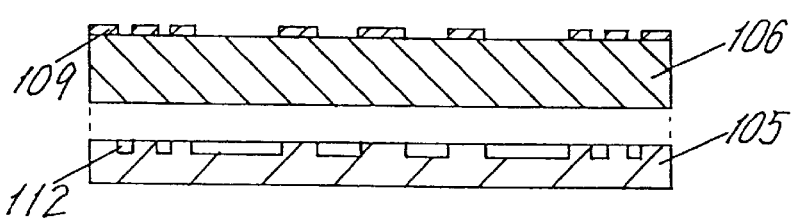
Figure 28C:
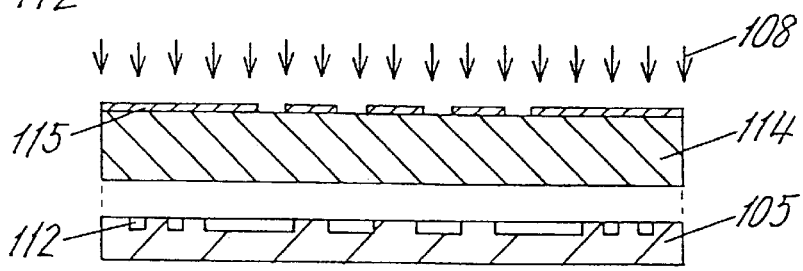
Figure 28D:
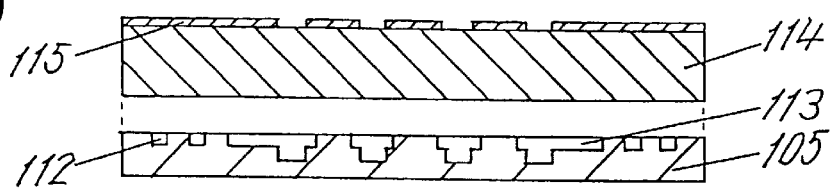
Figure 28E:
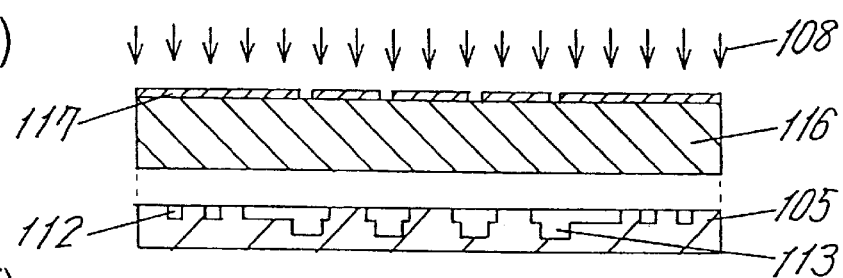
Figure 28F:
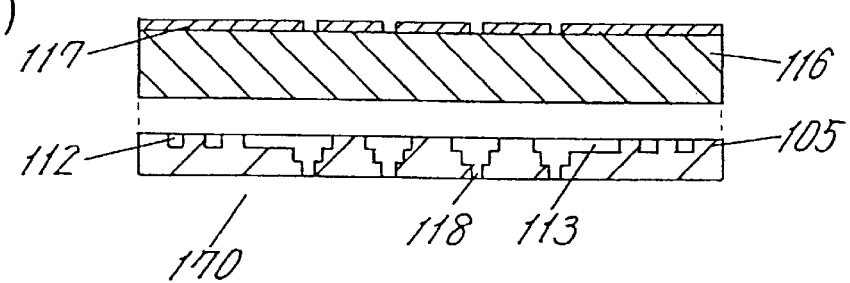
Figure 30A:
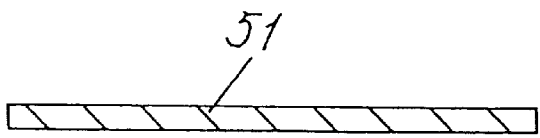
FIGS. 30(a)–(g) illustrates a manufacturing method of ceramic circuit board in a prior art.
Figure 30B:
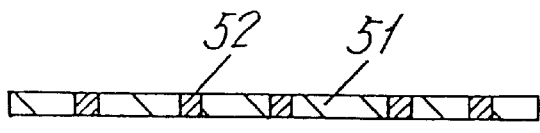
Figure 30C:
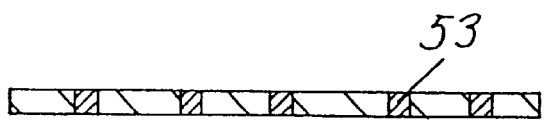
Figure 30D:
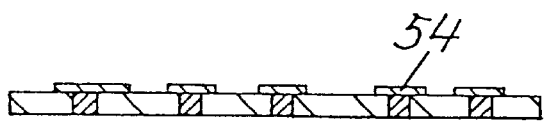
Figure 30E:
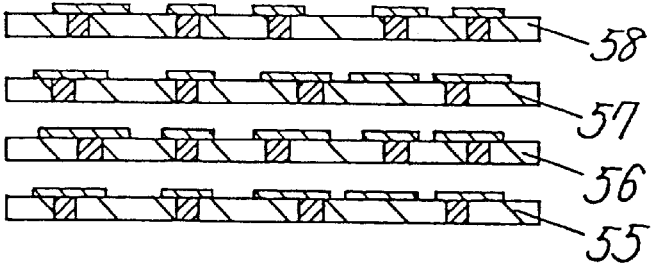
Figure 30F:
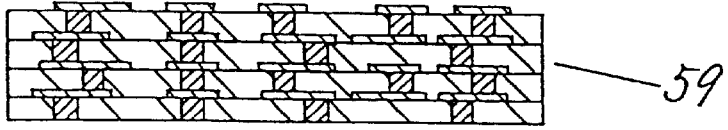
Figure 30G:
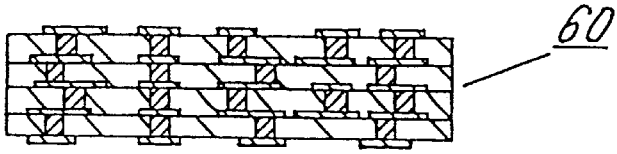

As shown in FIG. 29, the LSI chip 153 is mounted face down on the substrate with bump 172. At this time, an electrode 154 of the LSI chip 153 and the bump 172 are electrically connected through a conductive resin 155. In other method, solder may be used instead of the conductive resin 155.

In the CSP using thus formed ceramic substrate, same as in embodiment 6, the bump 172 and wiring pattern 171 can be formed in batch at the ceramic substrate 102 side. Further, since the bump 172 is formed in steps, at the parting step of the intaglio 170 as shown in FIG. 20, the bump 172 is not caught in the groove of the intaglio 170, so that it can be parted smoothly.

According to the invention, as explained herein, a fine wiring pattern of thick film can be formed easily, and a circuit board low in wiring resistance, high in wiring density, and high in dimensional precision of wiring pattern can be obtained.

Although the present invention has been fully described by way of examples with reference to the accompanying drawings, it is to be noted that various changes and modifications will be apparent to those skilled in the art. Therefore, unless such changes and/or modifications depart from the scope of the present invention as defined by the appended claims, they should be construed as being included therein.

What is claimed is:

1. A method of manufacturing a ceramic circuit board, comprising the steps of:
   (a) preparing an intaglio by forming a first groove on the surface of a flexible resin base material in a pattern corresponding to a desired conductor pattern, and forming a second groove in a pattern corresponding to the via or bump of the desired conductor pattern, the second groove being deeper than the first groove;
   (b) providing a conductive paste on said intaglio;

(c) filling the first and second grooves with said conductive paste, and defoaming the conductive paste utilizing ultrasonic vibration;

(d) drying said conductive paste, wherein conductive paste decreases in volume as a result of being dried;

(e) repeating steps (b) through (d) to replace the decreased volume of the conductive paste until the first and second grooves are substantially filled to a predetermined level;

(f) adhering said intaglio to a ceramic substrate by pressing said intaglio to the ceramic substrate while applying heat in a specified range; and (g) removing said intaglio from said ceramic substrate, thereby transferring a pattern of conductive paste on the ceramic substrate, and baking the pattern of conductive paste on the ceramic substrate to form a first conductor pattern, wherein the conductive paste is supplied at said steps (b) by using any one of screen mask, metal mask, and drawing device, and said step of defoaming the conductive paste is performed simultaneously with the step of filling the first and second grooves.

2. The method of manufacturing a ceramic circuit board of claim 1, wherein step (f) further includes the step of providing an adhesive layer on the ceramic substrate which adheres said intaglio to said ceramic substrate, said adhesive layer being greater than 1 $\mu$m to 20 $\mu$m in thickness, and being made of thermosetting resin or thermoplastic resin.

3. The method of manufacturing a ceramic circuit board of claim 1, wherein the step of defoaming the conductive paste is performed prior to drying the conductive paste.

4. The method of manufacturing a ceramic circuit board of claim 1, wherein step (b) further includes the step of providing a conductive paste having a thickness at least greater than the depth of the second groove.

5. The method of manufacturing a ceramic circuit board of claim 1, wherein the baking process in step (g) includes baking the first conductor pattern in a temperature profile with a peak temperature of 850 ° C., and having a temperature gradient of up to 200 ° C./Hr during the temperature elevation from 200 ° C. to 500 ° C.

6. A method of manufacturing a ceramic circuit board comprising the steps of:

(a) preparing an intaglio by forming a first groove on the surface of a flexible resin base material in a pattern corresponding to a desired conductor pattern, and forming a second groove in a pattern corresponding to the via or bump of the desired conductor pattern, the second groove being deeper than the first groove;

(b) providing a conductive paste on said intaglio;

(c) filling the first and second grooves with said conductive paste;

(d) drying said conductive paste, wherein conductive paste decreases in volume as a result of being dried;

(e) repeating steps (b) through (d) to replace the decreased volume of the conductive paste until the first and second grooves are substantially filled to a predetermined level;

(f) adhering said intaglio to a ceramic substrate by pressing said intaglio to the ceramic substrate while applying heat in a specified range;

(g) removing said intaglio from said ceramic substrate, thereby transferring a pattern of conductive paste on the ceramic substrate, and baking the pattern of conductive paste on the ceramic substrate to form a first conductor pattern, (h) printing and forming a first insulating layer on the first conductor pattern, and (i) printing and forming a second conductor pattern on the first insulating layer;

wherein the conductive paste is supplied at said steps (b) by using any one of screen mask, metal mask, and drawing device, and wherein step (h) further includes exposing vias of the first conductor pattern by removing a portion of the first insulating layer and then baking the first insulating layer, whereby baking of the first insulating layer causes volume reduction of the first insulating layer such that the vias project above the first insulating layer.

7. The manufacturing method of ceramic circuit board of claim 6, wherein the second conductor pattern is formed by the same process as the first conductor pattern.

8. A method of manufacturing a ceramic circuit board comprising the steps of:

(a) preparing an intaglio by forming a first groove on the surface of a flexible resin base material in a pattern corresponding to a desired conductor pattern, and forming a second groove in a pattern corresponding to the via or bump of the desired conductor pattern, the second groove being deeper than the first groove;

(b) providing a conductive paste on said intaglio;

(c) filling the first and second grooves with said conductive paste;

(d) drying said conductive paste, wherein conductive paste decreases in volume as a result of being dried;

(e) repeating steps (b) through (d) to replace the decreased volume of the conductive paste until the first and second grooves are substantially filled to a predetermined level;

(f) adhering said intaglio to a ceramic substrate by pressing said intaglio to the ceramic substrate while applying heat in a specified range;

(g) removing said intaglio from said ceramic substrate, thereby transferring a pattern of conductive paste on the ceramic substrate, and baking the pattern of conductive paste on the ceramic substrate to form a first conductor pattern, (h) printing and forming a first insulating layer on the first conductor pattern, and (i) printing and forming a second conductor pattern on the first insulating layer;

wherein the conductive paste is supplied at said steps (b) by using any one of screen mask, metal mask, and drawing device, and wherein step (h) further includes exposing vias of the first conductor pattern by baking the first insulating layer and then removing a portion of the baked first insulating layer such that the height of the vias and the height of the first insulating layers are on the same plane.

9. A method of manufacturing a ceramic circuit board comprising the steps of:

(a) preparing an intaglio by forming a first groove on the surface of a flexible resin base material in a pattern corresponding to a desired conductor pattern, and forming a second groove in a pattern corresponding to the via or bump of the desired conductor pattern, the second groove being deeper than the first groove;

(b) providing a conductive paste on said intaglio;

(c) filling the first and second grooves with said conductive paste;

(d) drying said conductive paste, wherein conductive paste decreases in volume as a result of being dried;

(e) repeating steps (b) through (d) to replace the decreased volume of the conductive paste until the first and second grooves are substantially filled to a predetermined level;

(f) adhering said intaglio to a ceramic substrate by pressing said intaglio to the ceramic substrate while applying heat in a specified range;

(g) removing said intaglio from said ceramic substrate, thereby transferring a pattern of conductive paste on the ceramic substrate, and baking the pattern of conductive paste on the ceramic substrate to form a first conductor pattern, (h) printing and forming a first insulating layer on the first conductor pattern, and (i) printing and forming a second conductor pattern on the first insulating layer;

wherein the conductive paste is supplied at said steps (b) by using any one of screen mask, metal mask, and drawing device, and wherein step (h) further includes exposing vias of the first conductor pattern by removing a portion of the first insulating layer, then baking the first insulating layer, and then removing a portion of the vias such that the height of the vias and the height of the first insulating layers are on the same plane.

10. A method of manufacturing a ceramic circuit board, comprising the steps of:

(a) preparing an intaglio by forming a first groove on the surface of a flexible resin base material in a pattern corresponding to a desired conductor pattern, and forming a second groove in a pattern corresponding to the via or bump of the desired conductor pattern, the second groove being deeper than the first groove;

(b) providing a conductive paste on said intaglio;

(c) filling the first and second grooves with said conductive paste;

(d) drying said conductive paste, wherein conductive paste decreases in volume as a result of being dried;

(e) repeating steps (b) through (d) to replace the decreased volume of the conductive paste until the first and second grooves are substantially filled to a predetermined level;

(f) adhering said intaglio to a ceramic substrate by pressing said intaglio to the ceramic substrate while applying heat in a specified range; and (g) removing said intaglio from said ceramic substrate, thereby transferring a pattern of conductive paste on the ceramic substrate, and baking the pattern of conductive paste on the ceramic substrate to form a first conductor pattern, wherein said second groove formed in said intaglio penetrates through said flexible resin base material.

11. The method of manufacturing a ceramic circuit board of claim 10, wherein the process of forming the second groove of step (a) further includes forming a third groove in the second groove, and the third groove formed in the intaglio penetrates through the flexible resin base material.

12. The method of manufacturing a ceramic circuit board of claim 11, wherein step (a) further includes forming each shape of the first, second and third grooves so that the size of the intaglio surface side and the size of the groove bottom side are equal to each other at each step.

13. The method of manufacturing a ceramic circuit board of claim 11, wherein step (a) further includes forming each of the first, second and third grooves so that each shape of the first, second and third grooves is formed to be smaller gradually from the intaglio surface side to the groove bottom side.

14. The manufacturing method of ceramic circuit board of claim 10, wherein, upon repetition, steps (b) through (d) further include applying, filling and drying a conductive paste to the back side of the intaglio in order to cover up for the volume loss due to drying of the conductive paste in step (d).

* * * * *